(12) United States Patent
Qu et al.

(10) Patent No.: US 11,515,171 B2
(45) Date of Patent: Nov. 29, 2022

(54) METHODS AND APPARATUS FOR TEMPERATURE MODIFICATION AND REDUCTION OF CONTAMINATION IN BONDING STACKED MICROELECTRONIC DEVICES

(71) Applicant: Micron Technology, Inc., Boise, ID (US)

(72) Inventors: Xiaopeng Qu, Bellevue, WA (US); Hyunsuk Chun, Boise, ID (US); Brandon P. Wirz, Boise, ID (US); Andrew M. Bayless, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 16/895,751

(22) Filed: Jun. 8, 2020

(65) Prior Publication Data
US 2021/0384042 A1    Dec. 9, 2021

(51) Int. Cl.
*H01L 21/447* (2006.01)
*H01L 21/67* (2006.01)
*H01L 21/033* (2006.01)
*B23K 20/02* (2006.01)

(52) U.S. Cl.
CPC ........ *H01L 21/447* (2013.01); *H01L 21/0337* (2013.01); *H01L 21/67092* (2013.01); *B23K 20/025* (2013.01); *B23K 20/026* (2013.01)

(58) Field of Classification Search
CPC ............... H01L 21/447; H01L 21/0337; H01L 21/67092; H01L 24/00; B23K 20/025; B23K 20/026; B23K 2101/36

USPC .......................................................... 257/66
See application file for complete search history.

(56) References Cited

U.S. PATENT DOCUMENTS

| | | | |
|---|---|---|---|
| 6,752,911 B2 * | 6/2004 | Jung | C23C 14/541 |
| | | | 204/298.18 |
| 9,243,894 B2 * | 1/2016 | Yamauchi | G01B 11/14 |
| 11,088,008 B2 * | 8/2021 | Kiuchi | H01L 21/78 |
| 2011/0020983 A1 | 1/2011 | Tomura et al. | |

OTHER PUBLICATIONS

Jung et al., A Study of 3D Packaging Interconnection Performance Affected by Thermal Diffusivity and Pressure Transmission, 2019 IEEE 69the Electronic Components and Technology Conference (ECTC), (2019), pp. 204-209.

Wirz et al., U.S. Appl. No. 16/693,192 titled Contaminant Control in Thermocompression Bonding of Semiconductors and Associated Systems and Methods, filed Nov. 22, 2019.

Taiwanese Search Report and Office Action from Taiwanese Application No. 110118198, dated Mar. 25, 2022, 13 pages with English translation.

* cited by examiner

*Primary Examiner* — Vu A Vu
(74) *Attorney, Agent, or Firm* — TraskBritt

(57) ABSTRACT

This patent application relates to methods and apparatus for temperature modification and reduction of contamination in bonding stacked microelectronic devices with heat applied from a bond head of a thermocompression bonding tool. The stack is substantially enclosed within a skirt carried by the bond head to reduce heat loss and contaminants from the stack, and heat may be added from the skirt.

37 Claims, 12 Drawing Sheets

US 11,515,171 B2

METHODS AND APPARATUS FOR TEMPERATURE MODIFICATION AND REDUCTION OF CONTAMINATION IN BONDING STACKED MICROELECTRONIC DEVICES

TECHNICAL FIELD

Embodiments disclosed herein relate to bonding of stacked microelectronic devices. More particularly, embodiments disclosed herein relate to methods and apparatus for temperature modification and reduction of contamination during collective bonding of a stack of microelectronic devices.

BACKGROUND

Over time, lead frame-based microelectronic device packages have yielded major market share to microelectronic devices utilizing an array of conductive elements protruding from a surface thereof for connection to terminal pads of another target microelectronic device or other substrate. The transition has been stimulated, in large part, by increased circuit density, increasing numbers of pinouts, and smaller form factor requirements in terms of the "footprint" of microelectronic devices. Such a configuration is often referred to as a "flip chip" configuration, as the microelectronic device is inverted so that the surface bearing the protruding conductive elements faces downward toward the target. While the flip chip configuration was initially implemented using solder balls or bumps in a so-called C4 (controlled collapse chip connection) structure, more recently requirements for smaller conductive elements and tighter pitches (i.e., spacing between conductive elements) to accommodate the smaller form factors in combination with increased number of pinouts have stimulated the use of conductive metal (e.g., copper) pillars as conductive elements. In some instances, the pillars bear solder caps, generally isolated from the copper pillar material by a thin barrier (e.g., nickel) material. In either instance, bonding between conductive elements of a microelectronic device and terminal pads of another has conventional been effected by application of heat to the assembly in a reflow oven to melt the solder, or by application of heat in combination with applied force by a thermocompression bond head to melt the solder or absent solder, to implement diffusion bonds between the metal pillars and aligned terminal pads.

As a part of the thermocompression bonding process, a dielectric material is interposed in the so-called "bond line" between adjacent, superimposed microelectronic devices to electrically isolate laterally adjacent conductive elements connecting the devices and provide electrical isolation between the superimposed microelectronic devices, as well as providing additional adhesion between the devices. In recent years, it has become more common to stack preformed dielectric films adhered to microelectronic devices or to dispense dielectric material on a microelectronic device before stacking, rather than dispensing a flowable dielectric material over each device during stacking, or using a post-stacking capillary underfill in the bond lines. Such preformed dielectric or pre-stacking dispensed material films are referred to as non-conductive films (NCFs), as well as wafer level underfill films (WLUFs).

DETAILED DESCRIPTION

Figure 1A:
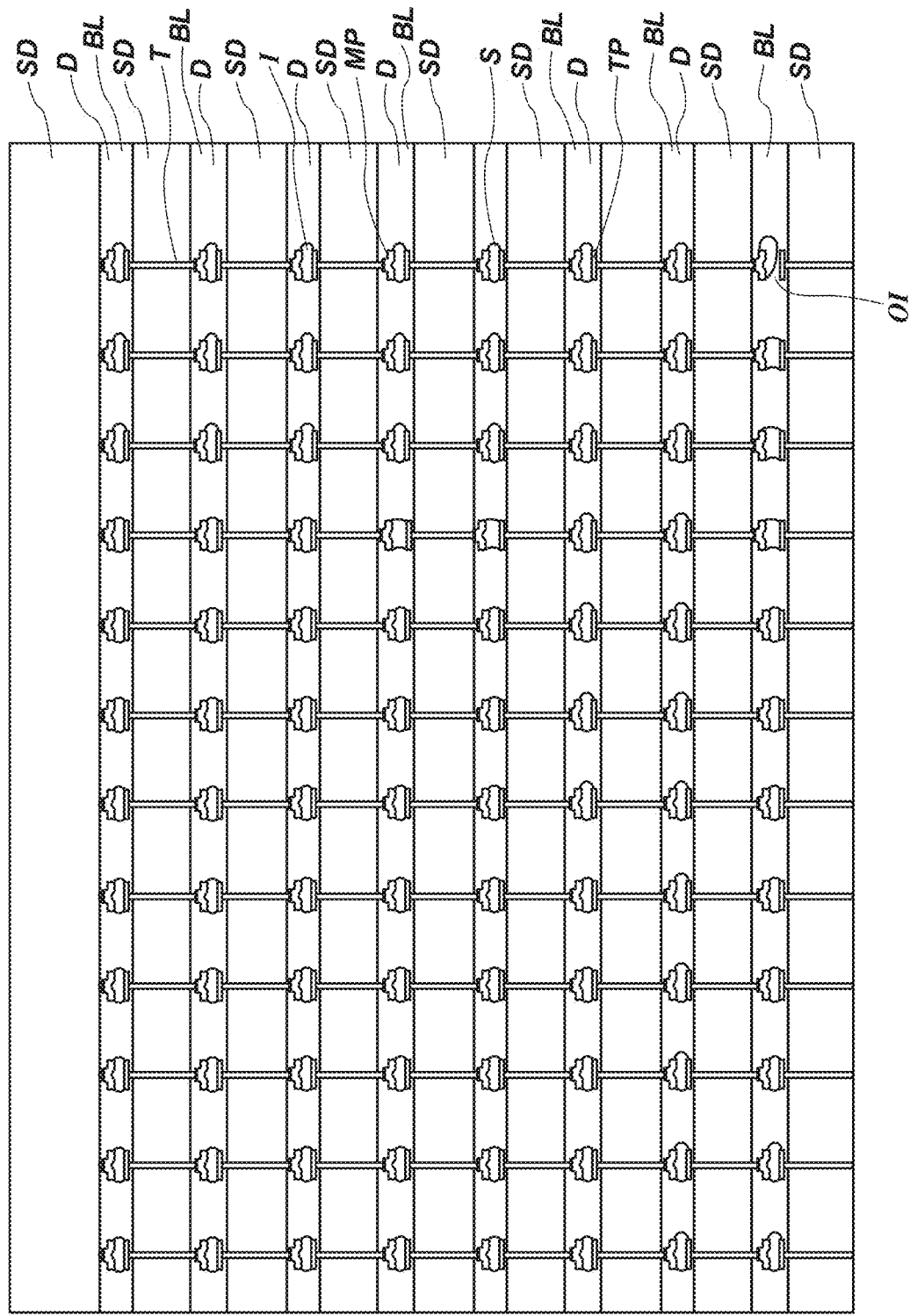
FIG. 1A is a schematic side partial cross-sectional view of a stack of microelectronic devices in the form of semiconductor dice and FIG. 1B is an enlargement of a portion of FIG. 1A showing an open interconnect.

Embodiments of the disclosure relate to methods and apparatus for controlling temperature, and more particularly temperature gradients, within a stack of microelectronic devices during mutual collective bonding of the microelectronic devices. Disclosed are bonding tools for controlled heating of stacks of microelectronic at various levels of device stacks, and methods of temperature control employing such bonding tools. Also disclosed are bonding tools configured to reduce contamination of neighboring microelectronic devices during bonding by restricting spread of such contaminants.

The following description provides specific details, such as sizes, shapes, material compositions, locations and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with conventional process acts and apparatus employed in the industry, suitably modified in accordance with the disclosure. In addition, the description provided below may not form a complete process flow for thermocompression bonding. Only those process acts and structures necessary to understand the embodiments of the disclosure are described in detail below.

Drawings presented herein are for illustrative purposes only, and are not meant to be actual views of any particular material, device, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another. In the description and for the sake of convenience, the same or similar reference numerals may be used to identify features and elements common between various drawing figures.

Mutual bonding of pillar-type conductive elements to terminal pads of another microelectronic device or substrate is conventionally effected by heat-induced mass reflow of the solder cap material, or by thermocompression bonding, wherein a bond head applies a Normal (i.e., vertical) downward force against a microelectronic device while heat is applied by the bond head. Both techniques may be suitable when only one, or a few, flip chip configured microelectronic devices are stacked and bonded. However, as the demand for increased circuit density continues, stacks of four, eight, twelve, sixteen or even more flip chip configured microelectronic devices require unacceptably increasing temperatures or dwell times in a mass reflow oven to effect bonding, straining the thermal budget of the microelectronic devices and increasing the potential for device failure. On the other hand, effective use of thermocompression bonding may be compromised by heat loss from the bond tip through the stack of microelectronic devices, as well as through the bond stage supporting the microelectronic device stacks and from sides of the assembly, resulting in difficulty in forming solder or diffusion bonds proximate the perimeter of the assembly. Heat loss issues are further exacerbated when thermocompression bonding is used for collective, or "gang" mutual bonding of greater numbers (e.g., four, eight, twelve, sixteen, etc.) of stacked microelectronic devices. In such instances, the relatively steep temperature gradient from the uppermost microelectronic device contacted by the bond tip of the bond head and the lowermost microelectronic device or substrate in the stack and from the center of the stack to the lateral periphery of the stack due to heat loss over the greater height of the assembly may result in lack of complete liquefaction of solder or failure to form a robust metal-to-metal diffusion bond. As a result, open interconnects may remain between the conductive elements and associated terminal pads adjacent the periphery of such an assembly. In addition, the heat loss and non-uniform heating of the stack may result in insufficient and/or non-uniform cure of the dielectric material, for example a non-conductive film (NCF) or wafer level underfill film (WLUF) in the bond line between adjacent devices in the stack, resulting in inconsistent bond line thickness, voids in the bond lines, or both. Further, while substrates bearing stacks of microelectronic devices may be thermocompression bonded using a bonding tool having a heated bond stage, bond stage temperature cannot be sufficiently high to compensate for heat loss through the stack of semiconductor devices without risking premature curing of the NCF or WLUF in lower bond lines in the stacks.

Figure 1B:
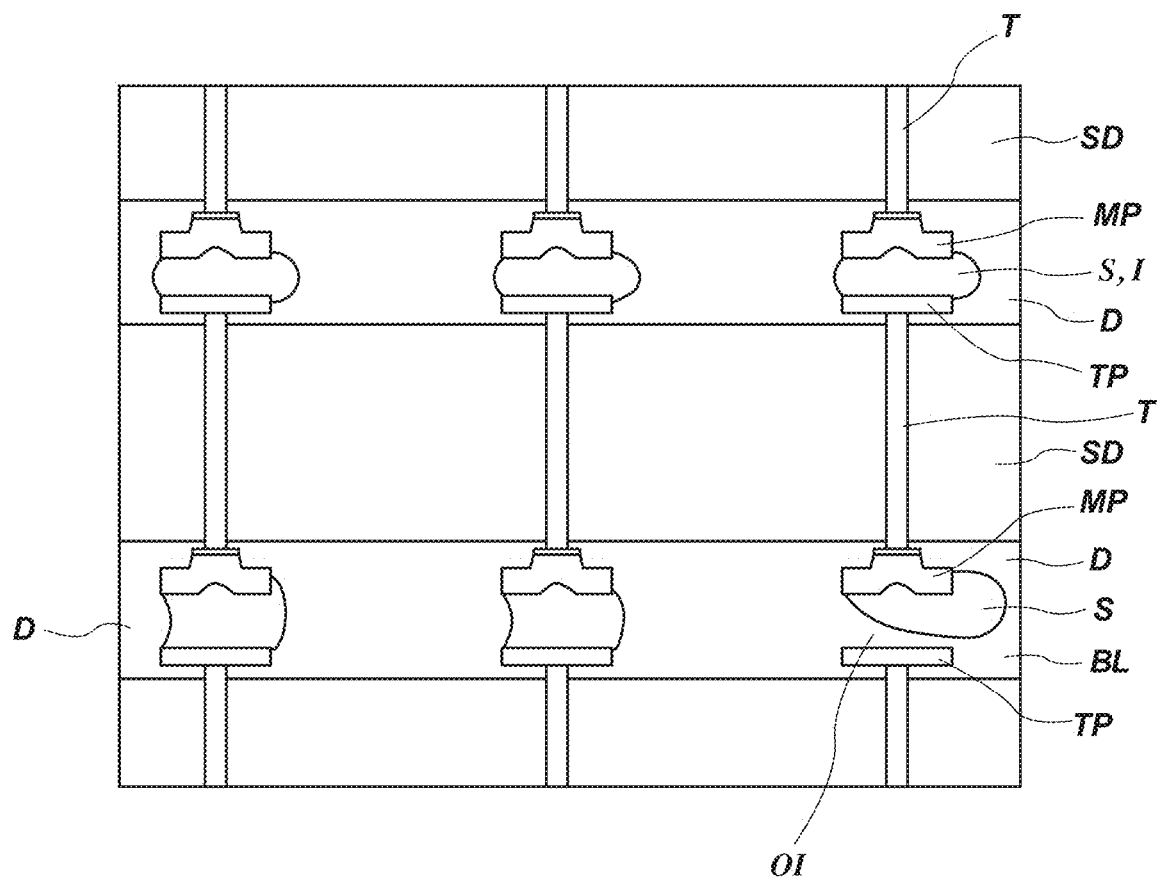

FIG. 1A shows a schematic side cross-section of an assembly of stacked and conventionally thermocompression-bonded microelectronic devices in the form of semiconductor dice SD, each die SD but for the uppermost die SD in the stack including through silicon vias (TSVs) T comprising conductive material isolated from the material of the semiconductor die, extending between major surfaces of the die, aligned with and respectively connected to conductive elements in the form of solder-capped metal pillars and on one major surface and terminal pads on an opposing major surface. Ideally, after thermocompression bonding, the solder S capping each metal pillar MP has been melted and cooled in contact with a terminal pad TP to form a robust interconnect bond I, as shown in the majority of instances in FIG. 1A. However, as shown at the lower right-hand corner of FIG. 1A, heat loss and associated insufficient temperature margin across a lateral extent of lower microelectronic devices may result in an open interconnect OI, even when undesirably using a maximum tool (i.e., bond tip of bond head) temperature. FIG. 1B is an enlarged portion of FIG. 1A and depicts the open interconnect OI in more detail, showing the complete lack of contact of terminal pad TP by solder S on metal pillar MP. Dielectric material D surrounding interconnects I, for example a NCF or WLUF is shown in the bond lines BL between adjacent devices, the sections comprising FIGS. 1A and 1B having been taken through the assembly after encapsulation.

Figure 2:
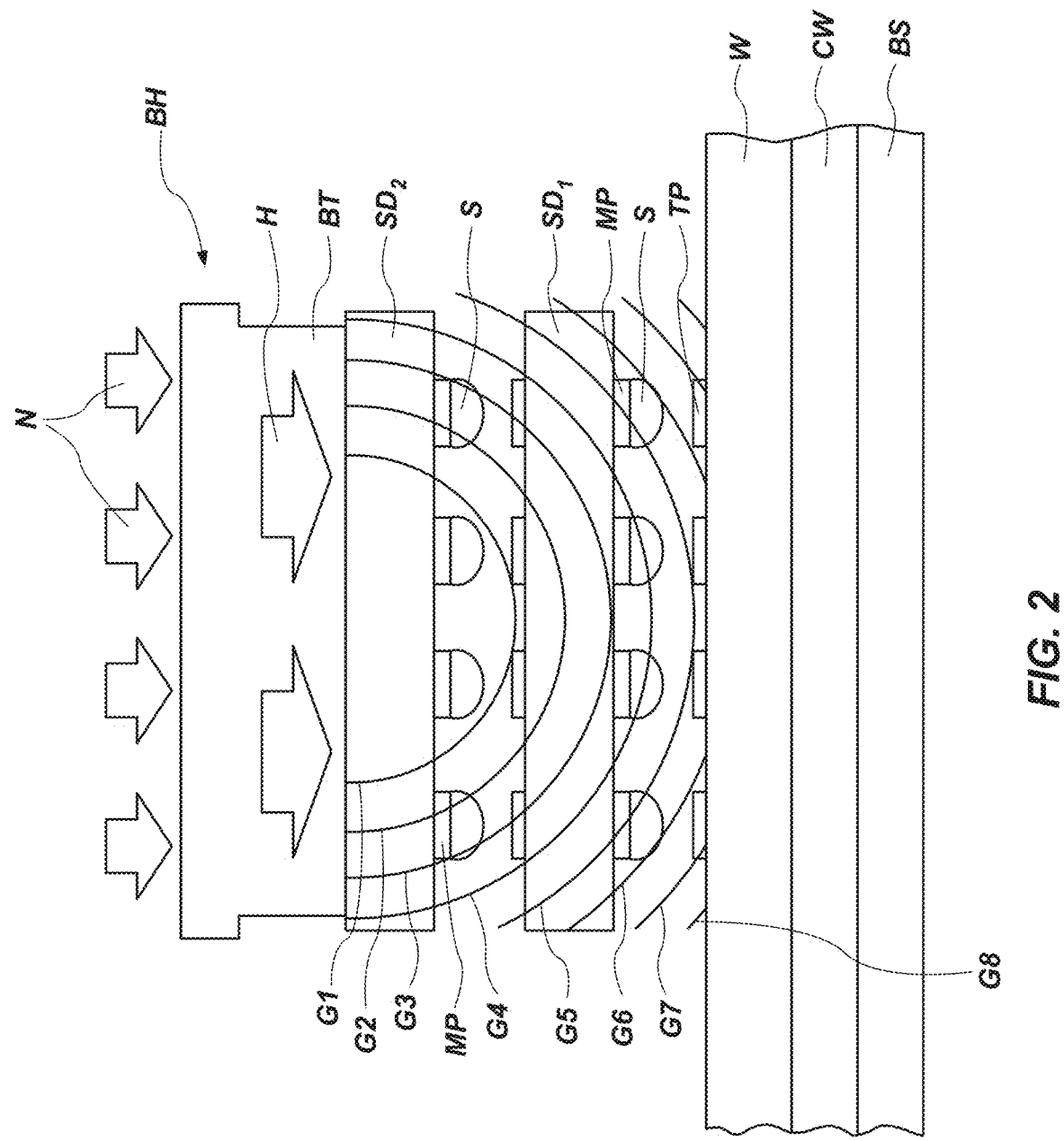
FIG. 2 is a schematic side view of a stack of semiconductor dice being thermocompression bonded by conventional techniques and graphically depicting a heat loss gradient from a bond tip of a bond head with greater distance downward and outward through the die stack.

FIG. 2 schematically depicts a heat gradient between a bond tip BT of thermocompression bond head BH and the bond stage BS of a thermocompression bonding tool during a thermocompression bonding operation wherein heat H and Normal force N are applied by bond head BH to a stack of microelectronic devices in the form of semiconductor dice $SD_1$ and $SD_2$ on a substrate, which may comprise a semiconductor wafer W supported on a carrier wafer CW on a bond stage BS of the thermocompression bonding tool. As can be readily seen and appreciated from the heat gradient lines G1 to G8, the farther heat travels longitudinally and laterally through the stack of semiconductor dice SD, the greater the heat loss and consequent likelihood that mutual bonding of conductive elements in the stack will not occur. As shown, undue heat loss may occur toward the perimeter of the lower semiconductor die $SD_1$ of the stack near wafer W in the area of heat gradient lines G7 and G8, preventing a robust interconnect between solder S, metal pillars MP and terminal pads TP at the periphery of lower semiconductor die $SD_1$. It is noted again that this heat loss phenomena is aggravated with increase in the number of microelectronic devices, and thus stack height.

While bond tip temperatures of 400° C. or even 450° C. have been employed, such temperatures may, as recognized by the inventors herein, prove inadequate for thermocompression bonding of, for example, eight or more stacked microelectronic devices due to a lack of a sufficiently high temperature at the peripheries of lower devices in the stack. Further, the use of high temperatures, on the order of those mentioned above, may exceed the thermal budget of, and damage, certain microelectronic devices, for example dynamic random access memory (DRAM) semiconductor dice. In addition, application of excessive heat from a bond head may result in premature curing of NCF or WLUF in the bond lines, resulting in failure of the NCF or WLUF to maintain a minimum viscosity to spread during thermocompression bonding and provide a thin and uniform bond line. As, for example, conventional Sn/Ag solders have a melting point of about 221° C. or Sn solders having a melting point of about 231° C. and even Indium solders require about 170° C. to melt, it is apparent that heat loss through a microelectronic device stack rapidly becomes problematic with even only a 10° C. temperature decline per microelectronic device vertically through a stack, which decline is exacerbated by the presence of dielectric material such as NCF or WLUF in the bond lines, and a further distance heat applied by a bond tip may travel from a centerline of the stack to a periphery of the stack. Thus, for example in a stack of eight (8) DRAM semiconductor devices, heat loss from top to bottom of the stack may easily exceed 80° C. along a centerline of the stack, whereas heat loss to the sides and particular corners of the stack may be measurably greater.

The use of such dielectric material of rectangular shape and sized to conform to the outer boundaries of microelectronic devices in a stack, in conjunction with thermocompression bonding techniques has resulted in yield issues as well as bond head contamination problems due to peripheral extension of filets (i.e., protrusions) of the dielectric film material beyond the sides of the devices, and to a greatest extent along mid-points of the sides, responsive to the Normal force and heat applied by the bond head. Specifically, the application of heat and force by the bond head causes "squeeze out" (i.e., extrusion) of peripheral portions of the dielectric film as the thickness of the film decreases until the aligned conductive elements of adjacent devices make contact and before the dielectric film is fully cured at a final bond line thickness between the devices. In addition, it has been observed by the inventors herein that in many instances the magnitude of peripheral portions of the dielectric film comprising filets becomes progressively greater from upper film levels in a stack to lower film levels. As a result, the filets of dielectric material may also protrude upwardly and contaminate the bond head, but even if this does not occur the presence of the filets may compromise the formation and integrity of an epoxy molding compound (EMC) on sides of a microelectronic device stack, cause flammability issues due to the exposed dielectric film, cause issues with package moisture absorption, or even extend between adjacent stacks of microelectronic devices formed on a base substrate, such as a base wafer, which may cause the aforementioned issues with the EMC as well as create warpage of the base wafer. Such filets result in non-linear device stack sides and other anomalies affecting thickness and continuity of the EMC, causing damage when adjacent microelectronic devices are singulated with a dicing saw cutting along streets incompletely filled with the EMC in the path of the saw blade. While currently stacks of microelectronic devices are generally separated by a fair distance, for example about 600 μm, this distance continues to shrink as circuit density increases, allowing for smaller microdevice size and more and more closely spaced devices per wafer.

Figure 3:
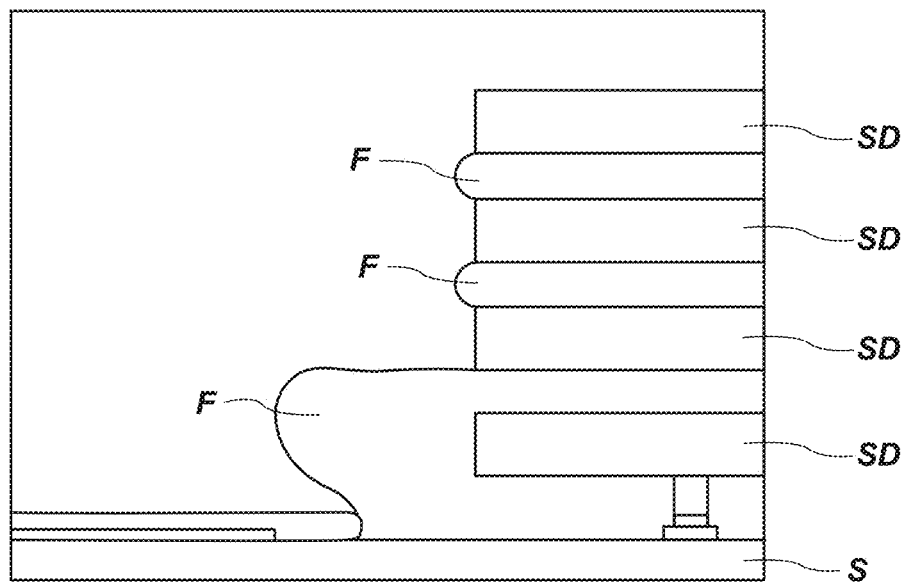
FIG. 3 is a side elevation photomicrograph of a thermocompression bonded semiconductor die stack showing a filet of dielectric material at a side of a semiconductor die stack configured as an HBM assembly.
Figure 4:
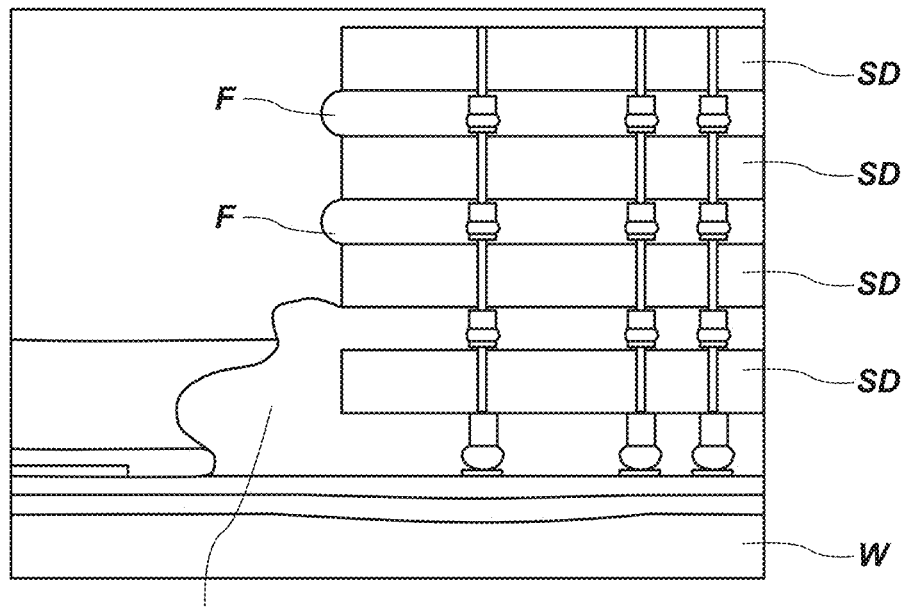
FIG. 4 is a side elevation of a thermocompression bonded semiconductor die stack on a base semiconductor wafer in a chip-to-wafer (C2W) assembly and showing a filet of dielectric material extruded beyond a side of the assembly.

As a specific example of the abovementioned problems, FIG. 3 is a schematic of filets F of dielectric film extruded beyond the sides of a stack of thermocompression bonded semiconductor dice SD of a stacked die assembly, the largest filet F located at the bottom of the stack between the lowermost die and supporting substrate S. Similarly, FIG. 4 is a schematic of dielectric filets F extruded at the base of and between the semiconductor dice SD of a semiconductor die stack thermocompression bonded to a base wafer W in a C2W assembly wherein outermost extents of the filets protrude substantially a common distance beyond sides of the stack.

Figure 5:
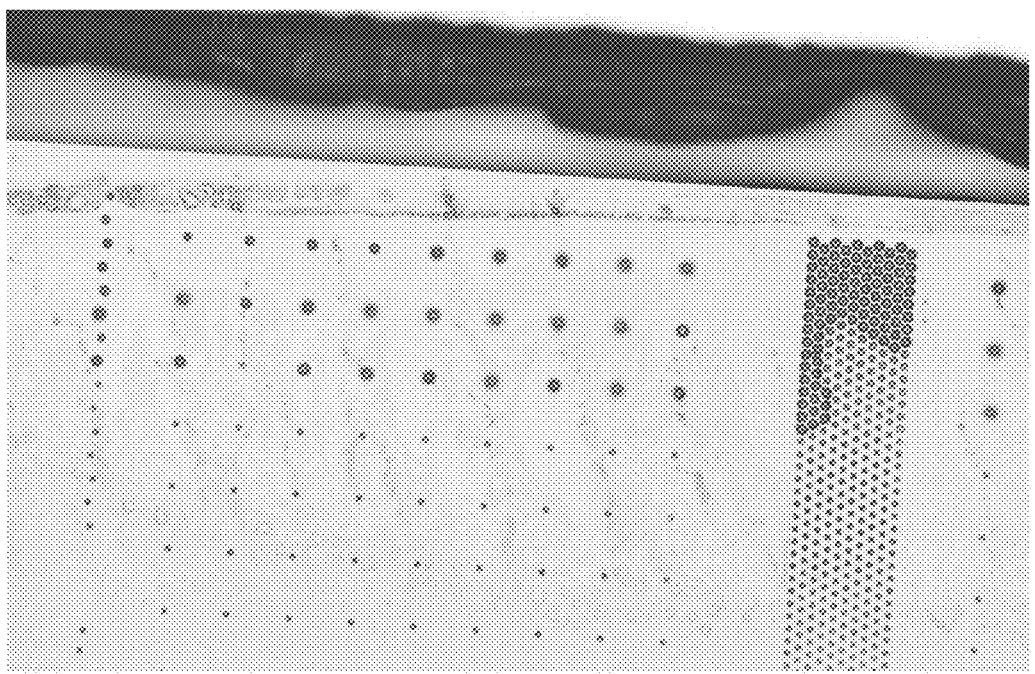
FIG. 5 is a photomicrograph of a die surface contaminated by outgassing of material from a thermocompression bonding process.

In addition to the foregoing problems, the use of dielectric material in the form of an NCF or WLUF in a microelectronic device (e.g., semiconductor die) stack causes outgassing from the dielectric material during a thermocompression bonding process, contaminating surfaces of neighboring components, for example fiducial marks and bond pads, the result of which is shown in the photomicrograph of FIG. 5. Further, other materials such as flux, the use of a non-conductive paste (NCF) in bond lines, and other materials present in the microelectronic device stack cause similar outgassing problems.

Figure 6:
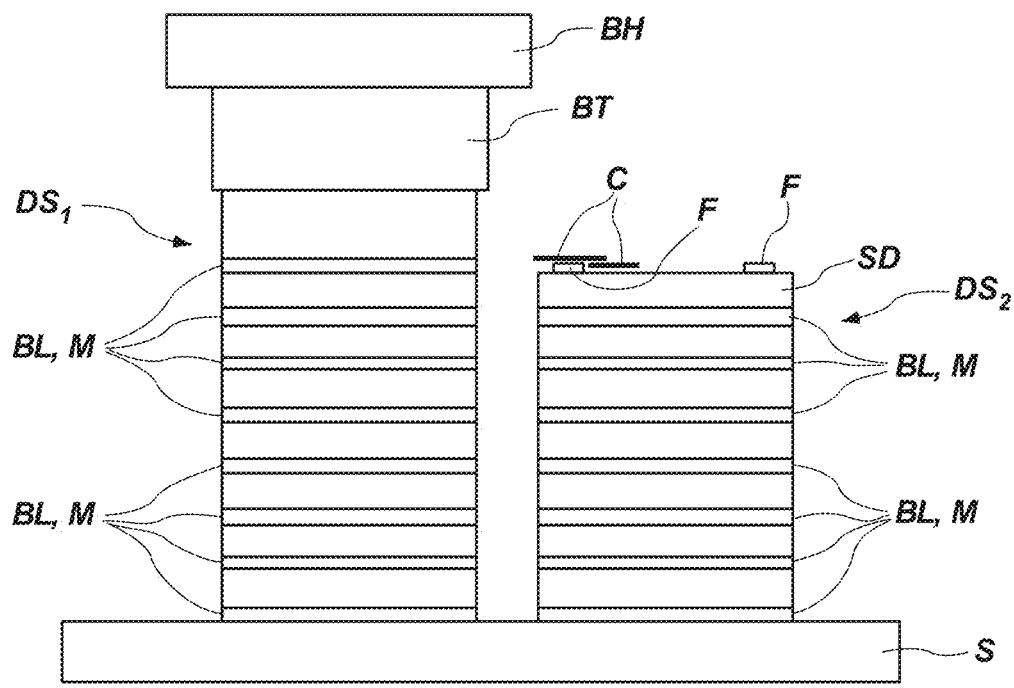
FIG. 6 is a side schematic elevation of adjacent die stacks on a substrate, one die stack being thermocompression bonded and outgassing contaminants on the neighboring die stack.

As shown in FIG. 6, a result of the outgassing of contaminants from dielectric and other materials M in bond lines BL of a die stack $DS_1$ of multiple semiconductor dice SD on a substrate S (e.g., wafer) undergoing thermocompression bonding with heated bond tip BT of bond head BH of a thermocompression bonding tool, is contaminant outgassed material C covering stacking fiducials F on upper surfaces of a top die SD of a neighboring die stack $DS_2$, causing recognition issues for optical sensors used in manipulation and bonding of semiconductor dice SD of neighboring die stack $DS_2$, producing die misalignment in neighboring die stack $DS_2$. Further, the outgassing of contaminants C may contaminate the bond tip BT of bond head BH, which contamination may be transferred to other die stacks or require replacement of the expensive bond tip. In addition, unknown reliability issues may result from coating under bump metallization (UBM) on back sides of semiconductor dice with epoxy or other contaminants occurring from outgassed contaminants from an NCF or other materials present during thermocompression bonding. Such issues include, by way of example only, poor interconnects such as solder non-wets, cold joints, open interconnects, head in pillar (HIP) defects (i.e., solder of a pillar slumps and pushes against a terminal pad and deforms, but isn't hot enough to melt and form a connection), or higher resistance interconnects.

Figure 7A:
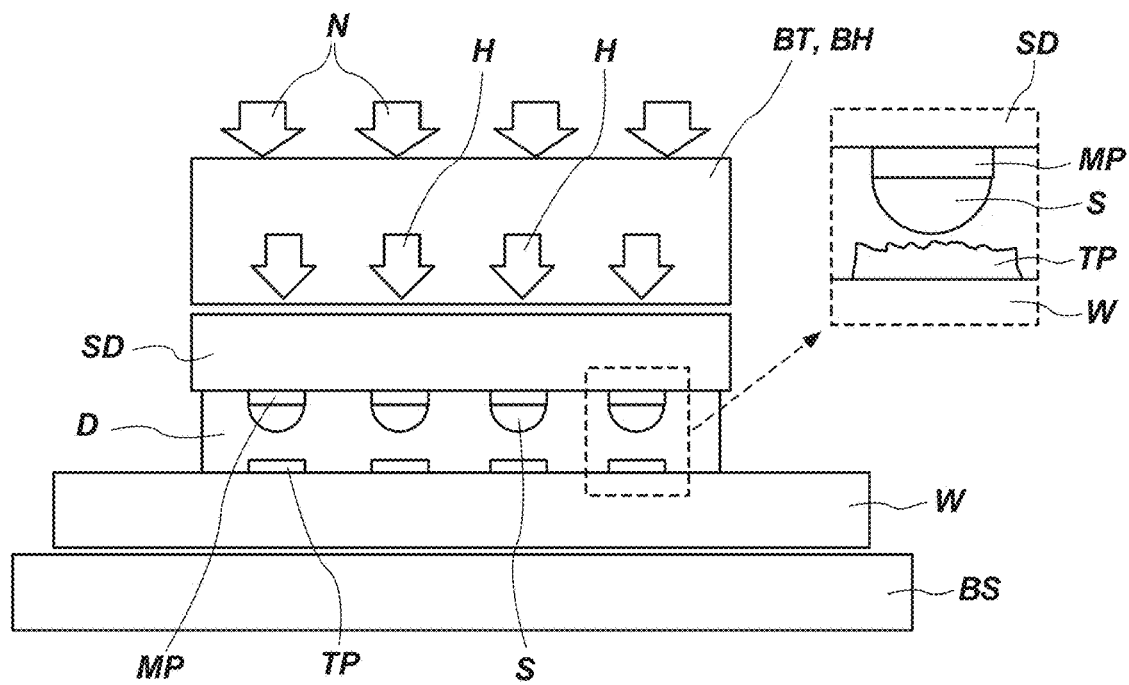
FIG. 7A is a schematic side view of a semiconductor die being thermocompression bonded to a semiconductor wafer by conventional techniques.
Figure 7B:
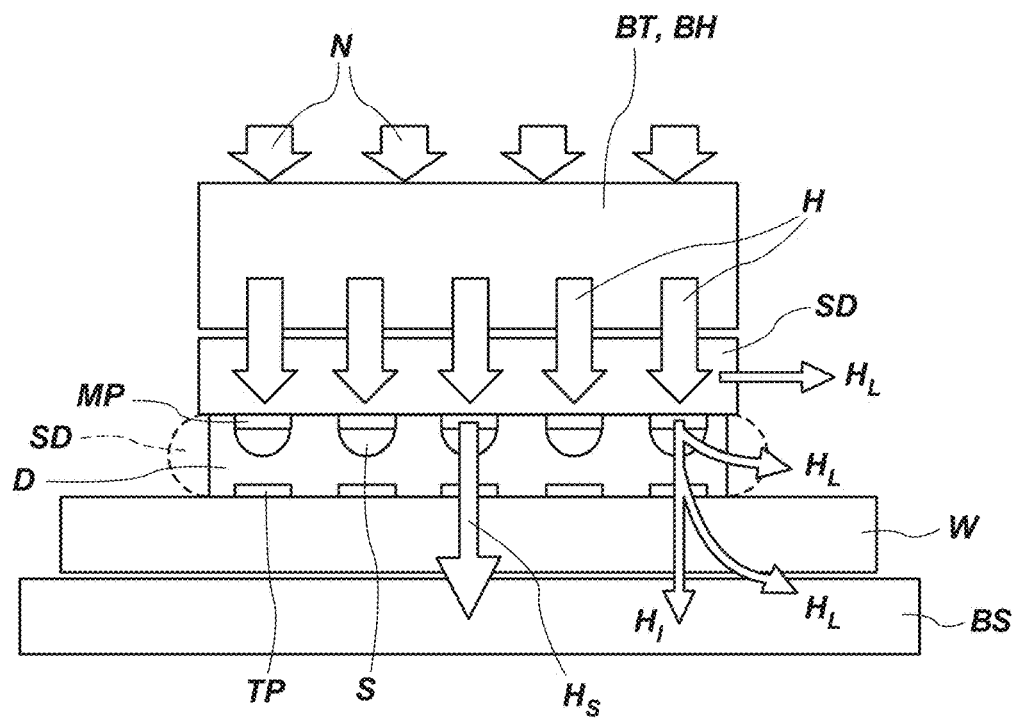
FIG. 7B is a schematic side view of the assembly of FIG. 7B during thermocompression bonding and depicting heat loss through and from a periphery of the assembly.

FIG. 7A, which is similar to FIG. 2, schematically depicts thermocompression bonding of a semiconductor die SD to semiconductor wafer W in a chip-on-wafer (COW) arrangement between a bond tip BT of thermocompression bond head BH and the bond stage BS of a thermocompression bonding tool by application of heat H and Normal force N by bond tip BT to cause formation of an interconnect between metal pillars MP of semiconductor die SD and terminal pads TP of wafer W by melting of solder S capping metal pillars MP, wicking of the molten solder S to aligned terminal pads TP, and solidification of solder S to bond to both metal pillars MP and terminal pads TP. Ideally, dielectric material D in the form of, for example, an NCF, is cured concurrently with the melting of solder S by applied heat H. However, as shown in FIG. 7B, while a center region of the semiconductor die SD and metal pillars MP, solder S and dielectric material D may experience sufficient heat Hs to melt solder S and form robust interconnects surrounded by cured dielectric material D, heat leakage HL proximate a periphery of semiconductor die SD through the thickness of the die, through the die periphery, through the dielectric material D and through the wafer W may result in insufficient heat Hi being experienced by solder S and adjacent dielectric material D near the die periphery, preventing a robust interconnect between solder S, metal pillars MP and terminal pads TP and insufficient cure of the dielectric material D, with excessive squeeze out SO of the dielectric material D as shown in broken lines.

Figure 8:
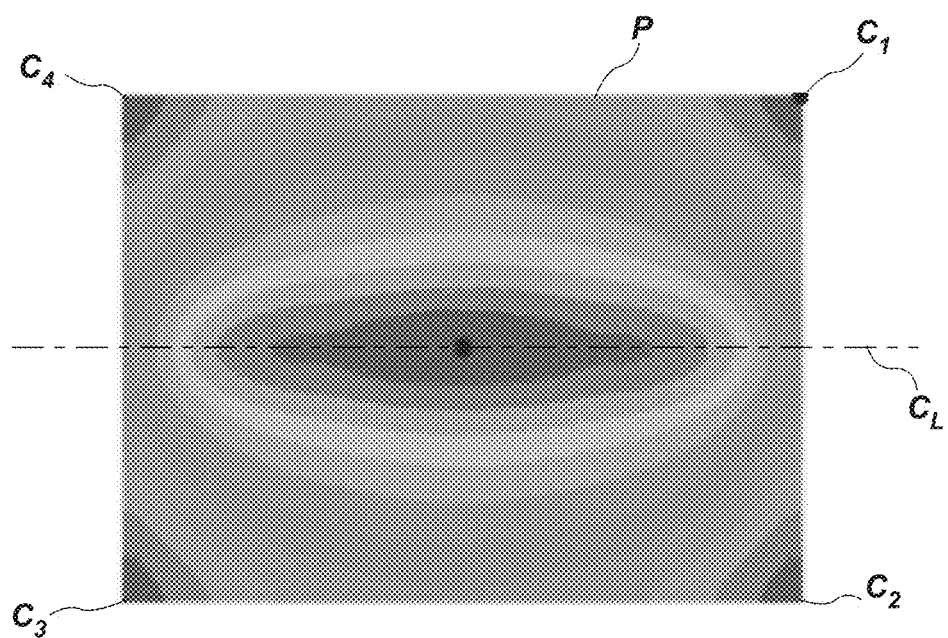
FIG. 8 is a is a finite element analysis heat map in gray scale illustrating the heat loss as depicted in FIG. 7B and described with respect thereto.

FIG. 8 of the drawings, in gray scale, is a finite element analysis heat map illustrating the heat loss as described above with respect to FIG. 7B from the elongated, dark, highest temperature central region along the centerline CL with gradual heat loss within the surrounding gray area of semiconductor die SD toward the die periphery P, and excessive heat loss within the die periphery P shown by progressively darker areas proximate corners $C_1$ through $C_4$.

Figure 9:
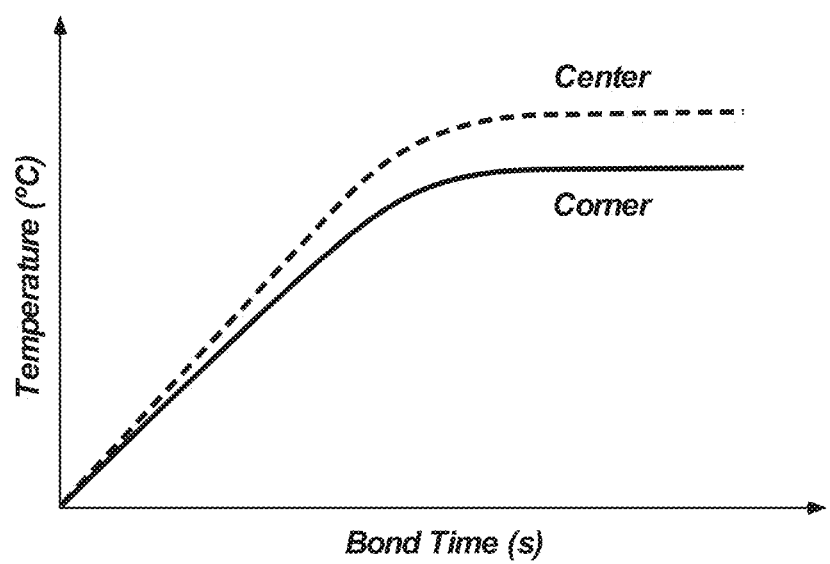
FIG. 9 is a graphical illustration of heat loss in a semiconductor die during a thermocompression bonding operation, shown as a lack of sufficient heat gain over time at corners of the die.

FIG. 9 is a graphical illustration of heat loss in a semiconductor die during a thermocompression bonding operation, shown as a lack of sufficient heat gain over time during the bonding operation at a Corner of a semiconductor die in comparison to heat gain in the Center of the semiconductor die, temperature at the Center peaking and stabilizing at a noticeably higher level than at the Corner.

Figure 10:
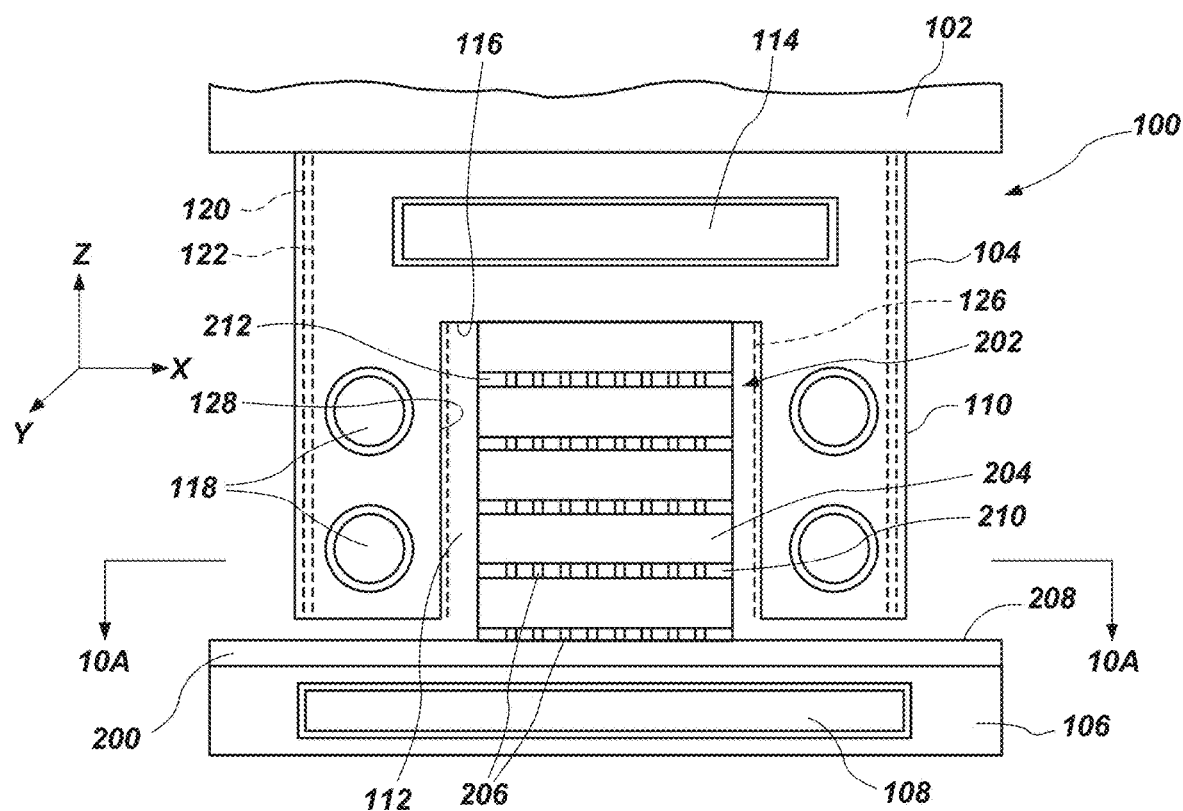
FIG. 10 is a side schematic partial sectional elevation of a thermocompression bonding tool according to an embodiment of the disclosure.
Figure 10A:
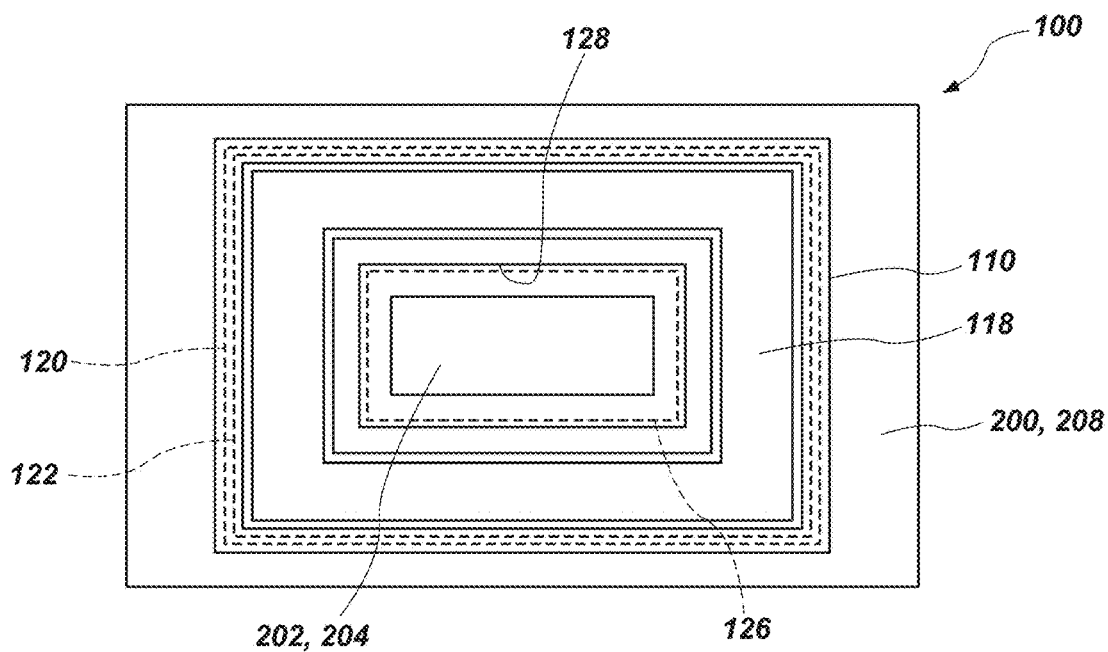
FIG. 10A is a schematic sectional elevation through section line A-A of FIG. 10.

Referring now to FIGS. 10 and 10A, an embodiment of a thermocompression bonding tool 100 is illustrated schematically. Thermocompression bonding tool 100 includes a bond head 102 carrying a bond tip assembly 104. Bond head 102 with bond tip assembly 104 is movable in the X, Y and Z planes under instructions from a controller and with the aid of position sensors, for example optical sensors, all as known in the art. Thermocompression bonding tool 100 also includes a bond stage 106 which may optionally include a stage heating device 108, which may comprise resistance-type heating elements under closed loop control by thermocouple. In operation, bond stage 106 supports, for example, a substrate 200 (e.g., semiconductor wafer, interposer, etc.), upon which is stacked a number of laterally spaced stacks 202 (only one shown) of microelectronic devices 204 (e.g., semiconductor dice) having arrays of conductive elements 206 in the form of, for example metal pillars capped with solder and aligned with terminal pads of a next-lower adjacent component as described and illustrated with respect to FIGS. 1 through 4, 7A and 7B. Although five microelectronic devices are illustrated in stack 202 of FIG. 10, for example four dynamic random access memory (DRAM in the form of DDR4, DDR5) dice stacked on a logic controller die in the form of a Hybrid Memory Cube (HMC) or a High Bandwidth Memory (HBM) stack of four dynamic random access memory (DRAM in the form of GDDR) on a device logic die, the stacks 202 of microelectronic devices 204 are not limited to a specific number of microelectronic devices 204. In practice, four, eight, twelve, sixteen or more microelectronic devices in the form of memory dice (e.g., dynamic random access memory (DRAM) dice) may be employed in a stack 202.

With respect to an in-place stack 202 of microelectronic devices 204, bond head 102 is aligned (e.g., optically) with a stack 202 and bond tip assembly 104 is lowered over the stack 202 so that skirt 110 providing a sidewall of bond tip assembly 104 surrounds stack 202 and extends to a level proximate upper surface 208 of substrate 200, substantially enclosing stack 202 in chamber 112. Bond tip assembly 104 includes a primary heating device 114 above compression surface 116 engaged with uppermost microelectronic device 204 of stack 202. Bond tip assembly 104 further includes one or more sidewall heating devices 118 (two shown) within, or mounted to, skirt 110. In a thermocompression bonding operation, when bond tip assembly 104 is placed over a stack 202 of microelectronic devices 204, primary heating device 114 and sidewall heating devices 118 are in an activated state to apply, respectively, conductive and convective and radiant heat to the top and sides of stack 202 while a Normal (i.e., vertical) force is applied to stack 202 by bond tip assembly 104 through compression surface 116, optionally with heat applied from stage heating device 108. Notably, sidewall heating device 118 may, as illustrated in FIG. 10A, be located on all sides of stack 202 of microelectronic devices 204. Primary heating device 114 and sidewall heating devices 118 may, for example, be resistance-type heaters. Primary heating device 114 may be ramped to operate at a temperature of between about 400° and about 450° C., sidewall heating devices 118 being operated at a temperature or temperatures sufficient to substantially offset heat loss vertically through and laterally from stack 202 of microelectronic devices 204 as depicted in FIGS. 2 and 7B of the drawings and to minimize the heat gradient from the top of stack 202 to the bottom. In this embodiment, sidewall heating devices 118 may, for example, be resistance-type heaters (e.g., printed conductors on a dielectric substrate) set for simplicity to operate at substantially a common temperature, for example between about 200° C. to about 250° C. under control of temperature sensors, for example thermocouples, to cycle power off at preselected temperatures to avoid overtemperature of the microelectronic devices 204 of stack 202 while ensuring robust bonding of conductive elements 206 and curing of dielectric material 210 (e.g., NCF, WLUF) in bond lines 212 and surrounding conductive elements 206. Optional stage heating device 108 may, if present, be operated at a temperature of between about 150° C. and about 160° C. under feedback control of thermocouples to contribute heat through substrate 200 and into stack 202. As a further option and as shown in broken lines, insulation 120, a heat-reflective material 122, or both (with insulation 120 placed outside of heat-reflective material 122) may be placed within skirt 110 laterally outside of sidewall heating devices 118 to contain heat within chamber 112 and shield heat from leaking to adjacent stacks of microelectronic devices 204 and initiating premature cure of dielectric material 210 of the neighboring stack before conductive elements 206 thereof can bond. As yet a further option, and as described more fully with respect to the embodiment of FIGS. 13 and 14, a low surface energy (LSE) material 126 as shown in broken lines may be applied to or formed on the inner wall 128 of skirt 110. Power to primary heating device 114 and sidewall heating devices 118 may be cycled on after bond tip assembly 104 is extended over a stack 202 of microelectronic devices 204, or bond tip assembly 104 may be continuously preheated, as is generally the case with stage heating device 108. During the bonding process and between bonding of stacks 202, power (i.e., current) to sidewall heating devices 118 may be varied, or cycled on and off, to maintain sidewall heating devices 118 within an appropriate temperature range. In one embodiment, sidewall heating devices may be activated before placement over a stack 202 of microelectronic devices 204, to take into consideration that sidewall heating devices 118, unlike primary heating device 114 of bond tip assembly, will not physically contact the stack 202 and conduct heat. In any case, thermocompression bonding conducted using such an embodiment may proceed more rapidly than conventional thermocompression bonding and produce a higher yield of interconnects of conductive elements 206 and fully cured dielectric material 210. In addition, substantially enclosing each stack 202 of microelectronic devices 204 in a chamber 112 during thermocompression bonding may substantially contain any contaminant materials outgassed from the stack 202 and reduce the potential for contamination of a neighboring stack 202.

Figure 11:
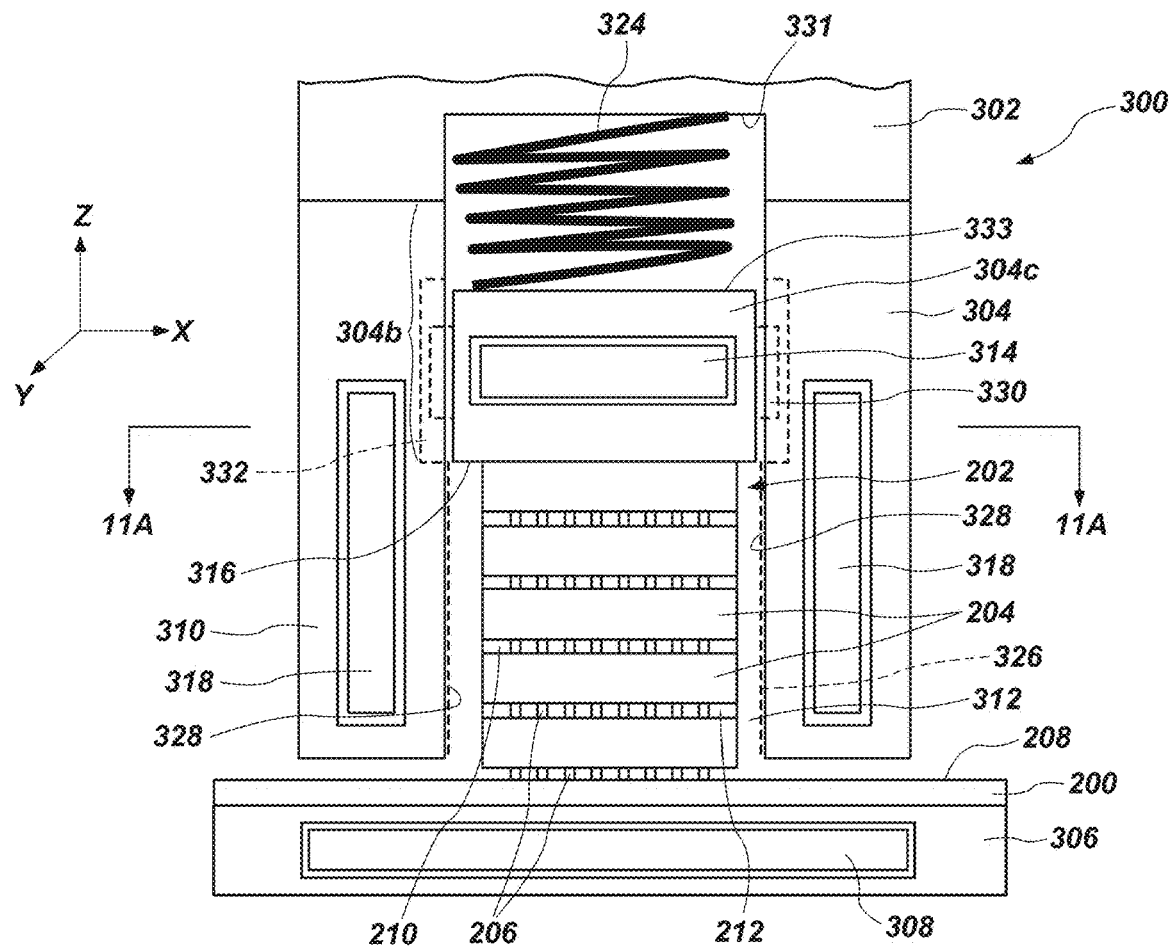
FIG. 11 is a side schematic partial sectional elevation of a thermocompression bonding tool according to another embodiment of the disclosure.
Figure 11A:
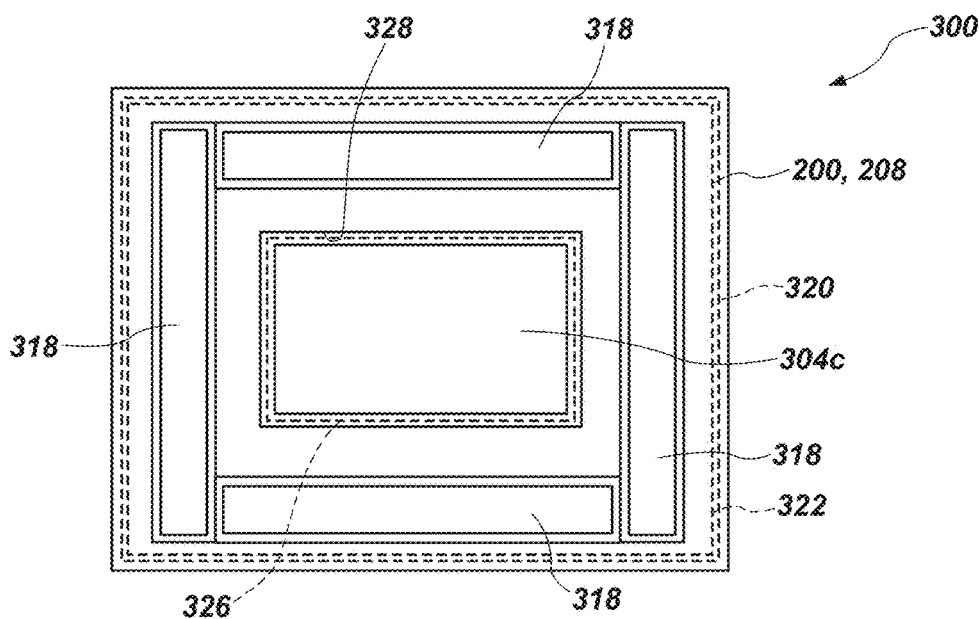
FIG. 11A is a schematic sectional elevation through section line A-A of FIG. 11.

Referring now to FIGS. 11 and 11A, an embodiment of a thermocompression bonding tool 300 is illustrated schematically. Thermocompression bonding tool 300 includes a bond head 302 carrying a bond tip assembly 304. Bond head 302 with bond tip assembly 404 is movable in the X, Y and Z planes under instructions from a controller and with the aid of position sensors, for example optical sensors, all as known in the art. Thermocompression bonding tool 300 also includes a bond stage 306 which may optionally include a stage heating device 308, which may comprise resistance-type heating elements under closed loop control by thermocouple. In operation, bond stage 306 supports, for example, a substrate 200 (e.g., semiconductor wafer, interposer, etc.), upon which is stacked a number of laterally spaced stacks 202 (only one shown) of microelectronic devices 204 (e.g., semiconductor dice) having arrays of conductive elements 206 in the form of, for example metal pillars capped with solder and aligned with terminal pads of a next-lower adjacent component as described and illustrated with respect to FIGS. 1 through 4, 7A and 7B. Although five microelectronic devices are illustrated in stack 202 of FIG. 10, for example four dynamic random access memory (DRAM in the form of DDR4, DDR5) dice stacked on a logic controller die in the form of a Hybrid Memory Cube (HMC) or a High Bandwidth Memory (HBM) stack of four dynamic random access memory (DRAM in the form of GDDR) on a device logic die, the stacks 202 of microelectronic devices 204 are not limited to a specific number of microelectronic devices 204. In practice, four, eight, twelve, sixteen or more microelectronic devices in the form of memory dice (e.g., dynamic random access memory (DRAM) dice) may be employed in a stack 202.

With respect to an in-place stack 202 of microelectronic devices 204, bond head 302 is aligned (e.g., optically) with a stack 202 and bond tip assembly 304 is lowered over the stack 202 so that skirt 310 providing a sidewall of bond tip assembly 304 surrounds stack 202 and extends to a level proximate upper surface 208 of substrate 200, substantially enclosing stack 202 in chamber 312. Unlike bond tip assembly 104 of the previous embodiment, bond tip assembly 304 comprises a separate bond tip compression member 304c having compression surface 316 on its underside, bond tip compression member surrounded by a bond tip barrel portion 304b of skirt 310 in which bond tip compression member 304c is slidably disposed. Bond tip compression member 304c is downwardly biased against stack 202 by compression element 324 located between ceiling 331 of bond tip barrel portion 304b and top 333 of bond tip compression member 304c. Compression element 324 may be, for example, a coil spring, a Belleville spring, a leaf spring, a resilient elastomer element, etc., having a spring constant selected to cause bond tip compression member 304c to apply a selected amount of Normal force to stack 202 of microelectronic devices 204 when bond tip assembly is in position over stack 202. Movement of bond tip compression member 304c within bond tip barrel portion 304b may be constrained to the vertical with, for example, keys 330 extending laterally from sides of bond tip compression member 304c into longitudinal slots 332 on the inside of bond tip barrel portion 304b of skirt 310 of bond tip barrel portion 304b, such an arrangement also maintaining bond tip compression member 304c within bond tip barrel portion 304b when withdrawn from a stack 202.

Bond tip compression member 304c of bond tip assembly 304 includes a primary heating device 314 immediately above compression surface 316 engaged with uppermost microelectronic device 204 of stack 202. Bond tip assembly 304 further includes one or more sidewall heating devices 318 (four shown) within, or mounted to, each sidewall of skirt 310 of bond tip barrel portion 304b. In a thermocompression bonding operation, when bond tip assembly 304 is placed over a stack 202 of microelectronic devices 204, primary heating device 314 and sidewall heating devices 318 are in an activated state to apply, respectively, conductive radiant and convective heat to the top and sides of stack 202 while a Normal (i.e., vertical) force is applied to stack 202 by bond tip assembly 304 through compression surface 316, optionally with heat applied from stage heating device 308. Primary heating device 314 may, for example, be a resistance-type heater ramped to operate at a temperature of between about 400° and about 450° C., sidewall heating devices 318 being operated at different temperatures sufficient to substantially offset heat loss vertically through and laterally from stack 202 of microelectronic devices as depicted in FIGS. 2 and 7B of the drawings. Notably, a discrete sidewall heating device 318 may, as illustrated in FIGS. 11 and 11A in combination, be located on each side of stack 202 of microelectronic devices 204. Each sidewall heating device 318 may, for example, comprise a series of resistance elements (e.g., printed conductors on a dielectric substrate) oriented vertically or horizontally or in a zig zag pattern and extending substantially a height and width of each inside sidewall of skirt 310. In one implementation, the resistance heating elements may be configured to exhibit a progressively higher resistance toward a lower end of skirt 310 to provide ever-greater heat to stack 202 offset heat loss through and from stack 202 of microelectronic devices 204 to control and minimize the heat gradient from the top of stack 202 to the bottom. In another implementation, the resistance heating elements may, be configured in an L-shaped transverse cross-section and be placed at corners of skirt 310 to focus heat proximate the corner areas of stack 202 most susceptible to heat loss. In this embodiment, resistance elements of sidewall heating devices 318 may, for example, be configured to operate at temperatures ranging from about 100° C. proximate an upper extent of skirt near compression surface 316 to about 200° to about 300° C. (depending on a number of microelectronic devices 204 in stack 202) proximate a lower extent of skirt 310. The resistance elements may operate under feedback control of temperature sensors, for example thermocouples, to cycle power off at preselected temperatures at each vertical level within skirt 310 to avoid overtemperature of the microelectronic devices 204 of stack 202 while ensuring robust bonding of conductive elements 206 and curing of dielectric material 210 (e.g., NCF, WLUF) in bond lines 212 and surrounding conductive elements 206. Alternatively, sidewall heating devices 318 may operate at substantially a common temperature from top to bottom of skirt 310, for example between about 200° C. to about 250° C. under control of temperature sensors. Optional stage heating device 308 may, if present, be operated at a temperature of between about 150° C. and about 160° C. under feedback control of thermocouples to contribute heat through substrate 200 and into stack 202. As a further option, insulation 320, a heat-reflective material 322, or both may be placed within skirt 310 laterally outside of sidewall heating devices 318 to contain heat within chamber 312 and shield heat from leaking to adjacent stacks 202 of microelectronic devices 204 and initiating premature cure of dielectric material 210 of the neighboring stack before conductive elements 206 thereof can bond. As yet a further option, and as described more fully with respect to the embodiment of FIGS. 13 and 14, a low surface energy (LSE) material 326 as shown in broken lines may be applied to or formed on the inner wall 328 of skirt 310. Power to primary heating device 314 and sidewall heating devices 318 may be cycled on after bond tip assembly 304 is extended over a stack 202 of microelectronic devices 204, or bond tip assembly 304 may be continuously preheated, as may stage heating device 308. During the bonding process and between bonding of stacks 202, power (i.e., current) to sidewall heating devices 318 may be varied, or cycled on and off, to maintain sidewall heating devices 318 within an appropriate temperature range. In one embodiment, sidewall heating devices may be activated before placement over a stack 202 of microelectronic devices 204, to take into consideration that sidewall heating devices 118, unlike primary heating device 114 of bond tip assembly, will not physically contact the stack 202 and conduct heat. In any case, thermocompression bonding conducted using such an embodiment of thermocompression bonding tool 300 may proceed more rapidly than conventional thermocompression bonding and produce a higher yield of interconnects of conductive elements 206 and fully cured dielectric material 210. In addition, substantially enclosing each stack 202 of microelectronic devices 204 in a chamber 312 during thermocompression bonding may substantially contain any contaminant materials outgassed from the stack 202 and reduce the potential for contamination of a neighboring stack 202.

Figure 12:
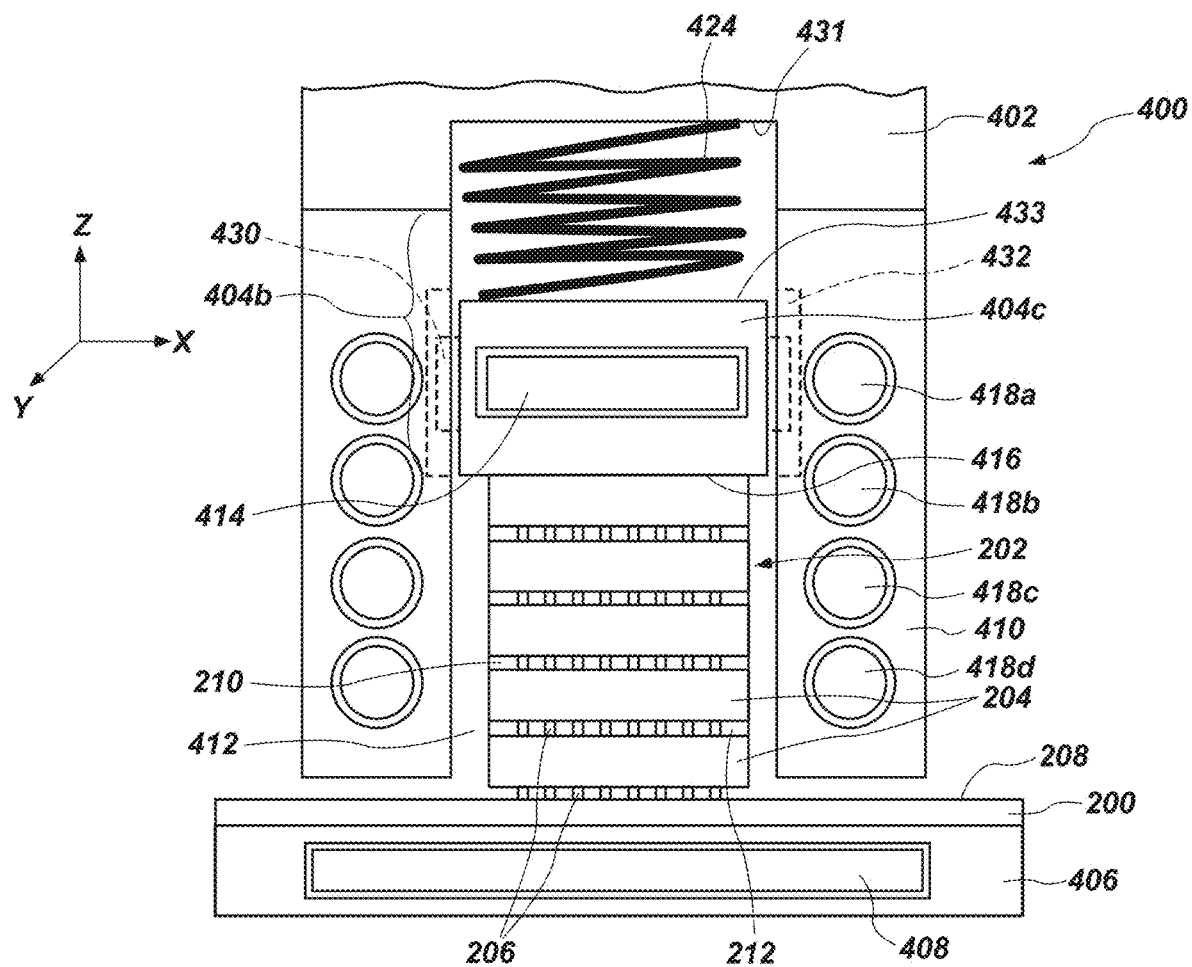
FIG. 12 is a side schematic partial sectional elevation of a further thermocompression bonding tool according to a further embodiment of the disclosure.

Referring now to FIG. 12, an embodiment of a thermocompression bonding tool 400 is illustrated schematically. Thermocompression bonding tool 400 includes a bond head 402 carrying a bond tip assembly 404. Bond head 402 with bond tip assembly 404 is movable in the X, Y and Z planes under instructions from a controller and with the aid of position sensors, for example optical sensors, all as known in the art. Thermocompression bonding tool 400 also includes a bond stage 406 which may optionally include a stage heating device 408, which may comprise resistance-type heating elements. In operation, bond stage 406 supports, for example, a substrate 200 (e.g., semiconductor wafer, interposer, etc.), upon which is stacked a number of laterally spaced stacks 202 (only one shown) of microelectronic devices 204 (e.g., semiconductor dice) having arrays of conductive elements 206 in the form of, for example metal pillars capped with solder and aligned with terminal pads of a next-lower adjacent component as described and illustrated with respect to FIGS. 1 through 4, 7A and 7B. Although five microelectronic devices are illustrated in stack 202 of FIG. 10, for example four dynamic random access memory (DRAM in the form of DDR4, DDR5) dice stacked on a logic controller die in the form of a Hybrid Memory Cube (HMC) or a High Bandwidth Memory (HBM) stack of four dynamic random access memory (DRAM in the form of GDDR) on a device logic die, the stacks 202 of microelectronic devices 204 are not limited to a specific number of microelectronic devices 204. In practice, four, eight, twelve, sixteen or more microelectronic devices in the form of memory dice (e.g., dynamic random access memory (DRAM) dice) may be employed in a stack 202.

With respect to an in-place stack 202 of microelectronic devices 204, bond head 402 is aligned (e.g., optically) with a stack 202 and bond tip assembly 404 is lowered over the stack 202 so that skirt 410 providing a sidewall of bond tip assembly 404 surrounds stack 202 and extends to a level proximate upper surface 208 of substrate 200, substantially enclosing stack 202 in open-bottomed chamber 412. Unlike bond tip assembly 104 of the first embodiment, bond tip assembly 404 comprises a separate bond tip compression member 404c in the form of a piston having compression surface 416 on its underside, bond tip compression member 404c surrounded by a bond tip barrel portion 404b in the bore of which bond tip compression member 404c is slidably disposed. Bond tip compression member 404c may be downwardly biased against stack 202 by resilient compression element 424 located between ceiling 431 of bond tip barrel portion 404b and top 433 of bond tip compression member 404c. Resilient compression element 424 may be, for example, a coil spring, a Belleville spring, a leaf spring, a resilient elastomer element, etc., having a spring constant selected to cause bond tip compression member 404c to apply a selected amount of Normal force to stack 202 of microelectronic devices 204 when bond tip assembly 404 is in position over stack 202. Movement of bond tip compression member 404c within bond tip barrel portion 404b may be constrained to the vertical with, for example, keys 430 extending laterally from sides of bond tip compression member 404c into longitudinal slots 432 on the inside of skirt 410 of bond tip barrel portion 404b, such an arrangement also maintaining bond tip compression member within bond tip barrel portion 404b when withdrawn from a stack 202.

Bond tip compression member 404c of bond tip assembly 404 includes a primary heating device 414 immediately above compression surface 416 engaged with uppermost microelectronic device 204 of stack 202. Bond tip assembly 404 further includes multiple levels of sidewall heating devices 418 (four shown) within, or mounted to, each sidewall of skirt 410 of bond tip barrel portion 404b, each level of sidewall heating device 418 extending substantially around chamber 412 as illustrated in FIG. 10A with respect to sidewall heating devices 118 of thermocompression bonding tool 100. In a thermocompression bonding operation, when bond tip assembly 404 is placed over a stack 202 of microelectronic devices 204, primary heating device 414 and sidewall heating devices 418 are in an activated state to apply, respective, conductive and radiant and convective heat to the top and sides of stack 202 while a Normal (i.e., vertical) force is applied to stack 202 by bond tip assembly 404 through compression surface 416, optionally with heat applied from stage heating device 408. Primary heating device 414 may, for example, be a resistance-type heater ramped to operate at a temperature of between about 400° and about 450° C., sidewall heating devices 418 being independently powered and controlled to operate at different temperatures sufficient to substantially offset heat loss vertically through and laterally from stack 202 of microelectronic devices as depicted in FIGS. 2 and 7B of the drawings. Notably, each level of discrete sidewall heating device 418 encircling stack 202 of microelectronic devices 204 may, for example, comprise a series of horizontally extending resistance elements (e.g., printed conductors on a dielectric substrate), it being understood that a given level of resistance elements may internally comprise a zigzag configuration to afford enhanced surface area coverage for heat transmission. In one implementation, the resistance heating elements of each level of sidewall heating devices 418 may be configured to exhibit a progressively higher resistance in levels progressing toward a lower end of skirt 410 to provide ever-greater heat to stack 202, or may receive progressively higher power input, to offset heat loss through and from stack 202 of microelectronic devices 204. In this embodiment, resistance elements of an uppermost level of sidewall heating device 418a may, for example, be configured to operate at temperatures ranging from about 100° C. to about 125° C. proximate an upper extent of skirt near compression surface 416. Mid-level sidewall heating devices 418b and 418c may, for example, be configured to operate respectively from about 150° C. to about 175° C. and about 200° C. to about 225° C. Lowermost sidewall heating device 418d proximate a lower extent of skirt 410 may, for example, be configured to operate from about 250° C. to about 275° C. Of course, the number of levels of sidewall heating devices and operating temperatures and temperature ranges may be adjusted by tailoring resistance of resistance elements at various levels, adjusting or switching applied power (i.e., current), or both, to offset heat loss and enhance uniformity of temperatures experienced by various microelectronic devices 204 in a stack 202 depending on the number of microelectronic devices 204. The resistance elements may operate under control of temperature sensors, for example thermocouples, to cycle power off at preselected temperatures at each vertical level within skirt 410 to avoid overtemperature of the microelectronic devices 204 of stack 202 while ensuring robust bonding of conductive elements 206 and curing of dielectric material 210 (e.g., NCF, WLUF) in bond lines 212 and surrounding conductive elements 206. Alternatively, sidewall heating devices 418 may operate at substantially a common temperature from top to bottom of skirt 410, for example between about 200° C. to about 250° C. under control of temperature sensors. Optional stage heating device 408 may, if present, be operated at a temperature of between about 150° C. and about 160° C. under feedback control of thermocouples to contribute heat through substrate 200 and into stack 202. As a further option, insulation, a heat-reflective material, or both (with insulation placed outside of heat-reflective material) as shown with respect to FIGS. 10, 10A, 11 and 11A may be placed within or on an exterior surface of skirt 410 laterally outside of sidewall heating devices 418 to contain heat within chamber 412 and shield heat from leaking to adjacent stacks 202 of microelectronic devices 204 and initiating premature cure of dielectric material 210 of the neighboring stack before conductive elements 206 thereof can bond. As a further option, a layer of transparent, low surface energy (LSE) material as shown with respect to FIGS. 10, 10A, 11 and 11A are shown and described more fully with respect to FIGS. 13 and 14 may be applied to or formed on compression surface 416 and the inner walls of skirt 410. Power to primary heating device 414 and sidewall heating devices 418 may be cycled on after bond tip assembly 404 is extended over a stack 202 of microelectronic devices 204, or bond tip assembly 404 may be continuously preheated, as may stage heating device 408. During the bonding process and between bonding of stacks 202, power (i.e., current) to sidewall heating devices 418 may be varied, or cycled on and off, to maintain sidewall heating devices 418 within an appropriate temperature range. In one embodiment, sidewall heating devices may be activated before placement over a stack 202 of microelectronic devices 204, to take into consideration that sidewall heating devices 118, unlike primary heating device 114 of bond tip assembly, will not physically contact the stack 202 and conduct heat. In any case, thermocompression bonding conducted using such an embodiment of thermocompression bonding tool 400 may proceed more rapidly than conventional thermocompression bonding and produce a higher yield of interconnects of conductive elements 206 and fully cured dielectric material 210. In addition, substantially enclosing each stack 202 of microelectronic devices 204 in a chamber 412 during thermocompression bonding may substantially contain any contaminant materials outgassed from the stack 202 and reduce the potential for contamination of a neighboring stack 202.

Figure 13:
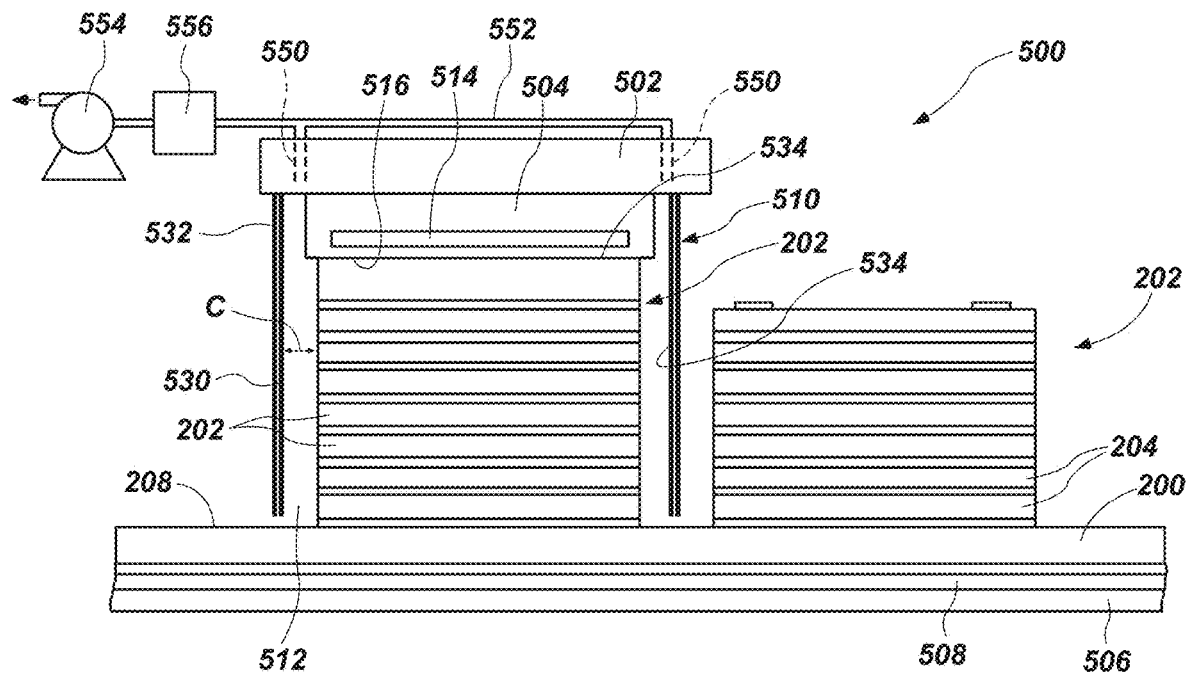
FIG. 13 is a side partial sectional elevation of a thermocompression bonding tool according to yet a further embodiment of the disclosure.
Figure 14:
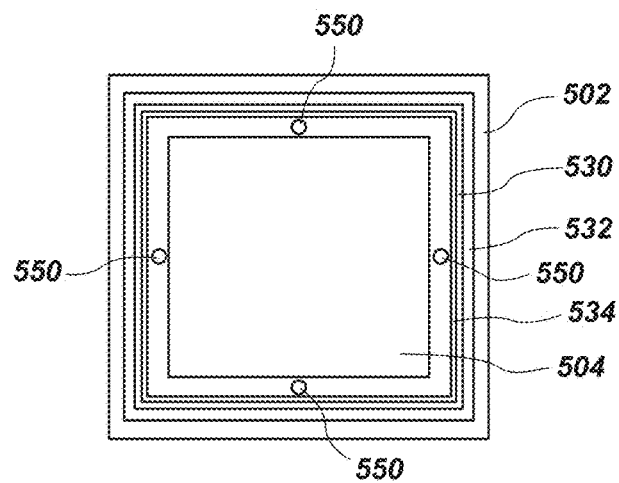
FIG. 14 is an elevation looking upwardly into a bond head skirt of the thermocompression bonding tool of FIG. 14 prior to disposition over a stack of microelectronic devices.

FIGS. 13 and 14 of the drawings illustrate an embodiment of a thermocompression bonding tool 500 including a bond head 502 carrying a bond tip 504. Bond head 502 with bond tip 504 is movable in the X, Y and Z planes under instructions from a controller and with the aid of position sensors, for example optical sensors, all as known in the art. Thermocompression bonding tool 500 also includes a bond stage 506 which may optionally include a stage heating device 508, which may comprise resistance-type heating elements under control of thermocouples at a temperature range of about 150° C. to about 160° C. In operation, bond stage 506 supports, for example, a substrate 200 (e.g., semiconductor wafer, interposer, etc.), upon which is stacked a number of laterally spaced stacks 202 of microelectronic devices 204 (e.g., semiconductor dice) having arrays of conductive elements in the form of, for example metal pillars capped with solder and aligned with terminal pads of a next-lower adjacent component as described and illustrated with respect to FIGS. 1 through 4, 7A and 7B, 10, 10A, 11, 11A, and 12. By way of example only, a stack 202 may include a number of dynamic random access memory (DRAM in the form of DDR4, DDR5) dice stacked on a logic controller die in the form of a Hybrid Memory Cube (HMC) or a High Bandwidth Memory (HBM) stack of dynamic random access memory (DRAM in the form of GDDR) on a device logic die. However, the stacks 202 of microelectronic devices 204 are not limited to a specific number of microelectronic devices 204. In practice, four, eight, twelve, sixteen or more microelectronic devices in the form of memory dice (e.g., dynamic random access memory (DRAM) dice) may be employed in a stack 202.

With respect to an in-place stack 202 of microelectronic devices 204, bond head 502 is aligned (e.g., optically) with a stack 202 and bond tip 504 is lowered over the stack 202 so that skirt 510 carried by bond head 502 and surrounding bond tip 504 and extends to a level proximate upper surface 208 of substrate 200, substantially enclosing stack 202 in chamber 512. Bond tip 504 includes a primary heating device 514 immediately above compression surface 516 engaged with uppermost microelectronic device 204 of stack 202. In a thermocompression bonding operation, when bond tip 504 is placed over a stack 202 of microelectronic devices 204, primary heating device 514 is in an activated state to apply heat from the top of stack 202 while a Normal (i.e., vertical) force is applied to stack 202 by bond tip 504 through compression surface 516, optionally with heat applied from stage heating device 508. To contain heat applied to stack 202 of microelectronic devices 204, skirt 510 surrounding the stack 202 may include an assembly of different materials. For example, for structural integrity and heat reflection, skirt 510 may be configured as a heat reflective material in the form of a thin (i.e., foil) metal (e.g., titanium, tungsten, copper) rectangular tube 530 exhibiting an interior highly reflective (e.g., mirror) finish, which may be achieved by electroless or electroplating, or sputtering a metal finish. The rectangular tube 530 is sized and configured to relatively closely encompass stack 202 with adequate clearance C to prevent contact with microelectronic devices 204 while reflecting heat into stack 202 and distributing heat vertically through the conductive foil material. Outside of tube 530 a layer of thermally insulative material 532 (e.g., silicon oxide, silicon nitride) may, optionally, be provided for further heat containment to stack 202 and to prevent unwanted heat transfer to a neighboring stack 202.

As a further option, a layer of transparent, low surface energy (LSE) material 534 such as, for example, a parylene HT or N material, a fluoropolymer such as a polytetrafluoroethylene (PTFE) material or a perfluoroalkoxyl (PFA) material, graphene, or diamond-like-carbon (DLC). A particular material of the foregoing types may, or may be formulated to, accommodate the application of heat and remain in a solid state without decomposition at a temperature of, for example, about 300° C. or more as employed in a thermocompression bonding process. Thermocompression bonding temperatures as high as about 400° C. are known, and in theory could be as low as about 220° C., the melting point of Sn. Such LSE materials by definition resist wetting by a liquid, exhibiting a large contact angle to a drop of liquid placed on the surface of the LSE material, and resist adhesion to other materials. The LSE material 534 may cover compression surface 516 and line the inside of skirt 510 in a thickness, for example, of about 2 µm to about 10 µm, although other thicknesses may be employed. For example, parylene may be conformally applied at a thickness from between about 0.1 µm to about 76 µm. The drawings herein exaggerate the thickness of the LSE material for clarity and, so are not to scale. LSE material 534 may stop excess flow of filets of dielectric material 210 (e.g., NCF, WLUF) from bond lines 212 along the perimeter of stack 202 to limit filet protrusion from bond lines 212 along the perimeter of stack 202 while preventing adhesion of the dielectric material 210 to the skirt 510 and prevent contamination of the dielectric material 210. In addition, the presence of skirt 510 will prevent joining of filets of dielectric material 210 of neighboring stacks 202 of microelectronic devices 204, a phenomenon which may initiate or enhance wafer warpage in downstream processing steps.

Primary heating device 514 may, for example, be a resistance-type heater ramped to operate at a temperature of between about 400° and about 450° which, even with added heat from stage heating device 508 but absent the presence of skirt 510, may not be sufficient to ensure bonding of conductive elements and complete cure of dielectric material at corners, periphery and lower device levels of stack 202. However, the presence of skirt 510 with metal foil tube 530 as a component of thermocompression bonding tool 500 may, by reflecting heat and distributing heat applied to stack 202 of microelectronic devices 204 within chamber 512, ensure robust bonding of conductive elements (e.g., metal pillars capped with solder to terminal pads) and curing of dielectric material (e.g., NCF, WLUF) in bond lines between microelectronic devices 204 and surrounding conductive elements. Insulative material 532 and a heat-reflective metal foil 530 contain heat within chamber 512 while shielding heat from leaking to adjacent stacks 202 of microelectronic devices 204 and initiating premature cure of dielectric material of the neighboring stack 202 before conductive elements thereof can bond. Power to primary heating device 514 may be cycled on (i.e., ramped up) after bond tip 504 is extended over a stack 202 of microelectronic devices 204, or bond tip 504 may be continuously preheated, as may stage heating device 508. During the bonding process and between bonding of stacks 202, power (i.e., current) to primary heating device 514 may be varied, or cycled on and off, to maintain primary heating device 514 within an appropriate temperature range. In any case, thermocompression bonding conducted using such an embodiment may proceed more rapidly than conventional thermocompression bonding and produce a higher yield of interconnects of conductive elements and fully cured dielectric material. In addition, substantially enclosing each stack 202 of microelectronic devices 204 in a chamber 512 during thermocompression bonding may substantially contain any contaminant materials outgassed from the stack 202 and reduce the potential for contamination of a neighboring stack 202.

As an additional feature, illustrated in FIGS. 13 and 14, one or more ports 550 may be provided in bond head 502, as shown in broken lines, or otherwise placed to open into chamber 512, ports 550 communicating through one or more conduits 552 with a vacuum source 554 to lower atmospheric pressure within chamber 512 to remove contaminant materials contained within chamber 512 by skirt 510 to a filter or trap 556. Vacuum source 554 may be selectively initiated prior to, or upon contact of, bond tip 504 with each stack 202 of microelectronic devices 204 being thermocompression bonded, or may operate continuously. While described and illustrated with respect to the embodiment of FIGS. 13 and 14, this feature may be incorporated into each other embodiment of the disclosure to function in the same manner.

It is noted that the size and widths of elements of the bond heads and skirts of the illustrated embodiments has been exaggerated for clarity. In implementation, the skirts of the bond heads and bond tip assemblies may be extremely thin laterally, to accommodate the close spacing of adjacent stacks of microelectronic devices. Such spacing may currently be in the range of about 300 µm to about 500 µm, and are expected to become smaller. Further, the interior of the skirts may be laterally spaced outside of the stack periphery, as contact with the die stack should be avoided. Further, as the length, width of microelectronic devices of different stacks will vary, as well as stack height due to differences in device thickness and number of devices in a stack, it will be understood by those of ordinary skill in the art that bond head and bond tip assemblies implementing embodiments of the disclosure may be customized for specific applications.

Figure 15:
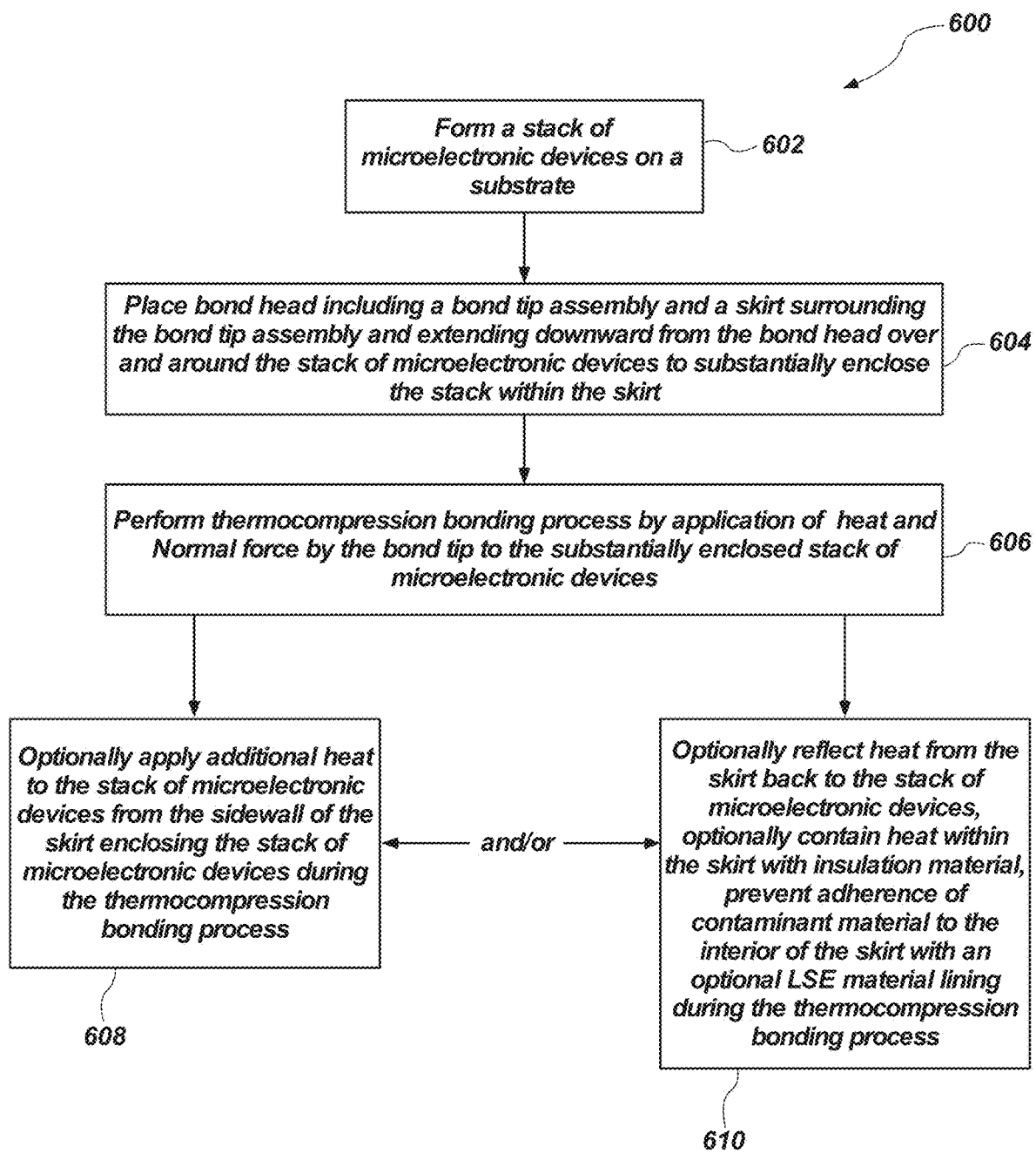
FIG. 15 is a flow diagram of a thermocompression bonding process according to embodiments of the disclosure.

FIG. 15 is a flow diagram of a thermocompression bonding process 600 according to embodiments of the disclosure. In act 602, a stack of microelectronic devices are formed on a substrate. In act 604, a bond head including a bond tip assembly and a skirt extending downwardly from the bond head and surrounding the bond tip is placed over and around the stack of microelectronic devices to substantially enclose the stack. In act 606, a thermocompression bonding process is performed by application of heat and Normal force by the bond tip to the enclosed stack of microelectronic devices. In act 608, additional heat is optionally applied to the stack of microelectronic devices from the sidewall of the skirt enclosing the stack of microelectronic devices during the thermocompression bonding process. In act 610, heat is optionally reflected from the skirt back to the stack of microelectronic devices, optionally contained within the skirt with insulation material and contaminant material is prevented from adhering to the interior of the skirt with an optional LSE material lining during the thermocompression bonding process. Of course, optional process act 608 may be combined with any or all of optional process acts 610.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. The term "substrate" also means and includes organic substrates, for example, substrates having multiple metal layers in the form of traces and is interposed with dielectric layers (e.g., resin-glass weave polymers). For example, conventional BGA packages include multiple die and encapsulation (e.g., epoxy molding compound (EMC)) on one side of an organize substrate and an array of solder balls on the other side.

As used herein, the term "microelectronic device" means and includes by way of non-limiting example, semiconductor die, die exhibiting functionality through other than semiconductive activity, microelectrical mechanical systems (MEMs) devices, substrates comprising multiple die including conventional wafers as well as other bulk substrates as mentioned above, and partial wafers and substrate segments including more than one die location.

As used herein, the term "memory device" means and includes, by way of non-limiting example, semiconductor and other microelectronic devices exhibiting memory functionality, but not excluding other functionality unless otherwise clearly indicated by the context of use of the term.

As used herein, the terms "metal" and "metal material" mean and include, unless otherwise expressly stated, elemental metals, metal alloys and combinations (e.g., layers) of different and adjacent metals or metal alloys.

As used herein, the terms "dielectric film" and "dielectric material" mean and include preformed or dispensed dielectric material films applied before microelectronic device stacking and known as NCFs and WLUFs, as well as non-conductive paste (NCF) dielectric materials. Such dielectric films typically comprise a silica particle-filled epoxy-type thermosetting resin at a B-stage partial cure, provide consistent thicknesses, may include a flux for the aforementioned solder reflow where applicable, and facilitate stacking of microelectronic devices with a segment of dielectric film already in place on each singulated device before stacking.

Embodiments of the disclosure comprise a thermocompression bonding apparatus comprising a bond stage and a bond head movable in X, Y and Z directions. The bond head includes a bond tip having a compression surface on an underside thereof, the bond tip including a primary heating device and a skirt extending downwardly from the bond head, surrounding the bond tip and laterally encompassing an open-bottomed chamber.

Embodiments of the disclosure comprise. a method comprising aligning a bond head of a thermocompression bonding tool with a stack of microelectronic devices and lowering the bond head over the stack of microelectronic devices to substantially enclose the stack in a chamber within a skirt extending downward from the bond head and to contact an uppermost microelectronic device of the stack with a bond tip of the bond head within the chamber. Heat is applied from the bond tip to the stack of microelectronic devices through the uppermost microelectronic device and heat loss from the bond tip through the stack of microelectronic devices and from a periphery of the stack is reduced with the skirt.

Embodiments of the disclosure comprise a method comprising aligning a bond head of a thermocompression bonding tool with a stack of microelectronic devices, lowering a bond head of a thermocompression bonding tool over a stack of microelectronic devices, heating the stack of microelectronic devices with the bond head and substantially containing contaminant material outgassed from bondlines between microelectronic devices of the stack within a skirt carried by the bond head and substantially enclosing the stack.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of one or more other disclosed embodiments while still being encompassed within the scope of the disclosure.

What is claimed is:

1. A thermocompression bonding apparatus, comprising:
    a bond stage;
    a bond head movable in X, Y and Z directions, the bond head including:
    a bond tip having a compression surface on an underside thereof, the bond tip including a primary heating device; and
    a skirt carried by and movable with the bond head, the skirt extending vertically downward from the bond head surrounding the bond tip and laterally encompassing an open-bottomed chamber sized to encompass a single stack of microelectronic devices.

2. The thermocompression bonding apparatus of claim 1, wherein the skirt and the bond tip, in combination, comprise a bond tip assembly, and the skirt includes one or more sidewall heating devices.

3. The thermocompression bonding apparatus of claim 2, wherein one or more of the one or more sidewall heating devices extend substantially around the chamber.

4. The thermocompression bonding apparatus of claim 2, wherein the one or more sidewall heating devices comprise two or more horizontally oriented and vertically superimposed sidewall heating devices.

5. The thermocompression bonding apparatus of claim 4, wherein the two or more sidewall heating devices extend substantially around the chamber.

6. The thermocompression bonding apparatus of claim 4, wherein each of the two or more horizontally oriented and vertically superimpose sidewall is either configured to provide a different amount of heat or controllable to provide a different amount of heat.

7. The thermocompression bonding apparatus of claim 3, wherein the one or more sidewall heating devices comprise a sidewall heating device extending vertically and horizontally along each side of the skirt.

8. The thermocompression bonding apparatus of claim 6, wherein each sidewall heating device is configured to provide an increasing amount of heat with increasing vertical distance from the bond tip or controllable to provide a different amount of heat with increasing vertical distance from the bond tip.

9. The thermocompression bonding apparatus of claim 1, wherein the bond stage includes a stage heating device.

10. The thermocompression bonding apparatus of claim 2, wherein the skirt further comprises one or more of a thermally insulative material extending vertically along the skirt from proximate a top of the chamber to proximate a bottom of the chamber and circumferentially around the chamber laterally outside of the one or more sidewall heating devices, a heat reflective material extending vertically along the skirt from proximate a top of the chamber to proximate a bottom of the chamber and circumferentially around the chamber laterally outside of the one or more sidewall heating devices, and a low surface energy (LSE) material lining an inside surface of the skirt.

11. The thermocompression bonding apparatus of claim 10, wherein the skirt comprises the thermally insulative material surrounding the heat reflective material, and the LSE material lining the inside surface of the skirt.

12. The thermocompression bonding apparatus of claim 2, wherein the one or more sidewall heating devices are configured to provide sufficient heat to a stack of microelectronic devices located on the bond stage to at least partially offset loss of heat applied by the primary heating device of the bond tip to initiate bonding of discrete conductive elements between microelectronic devices of the stack and curing of dielectric material located in bond lines between the microelectronic devices and surrounding the discrete conductive elements.

13. The thermocompression bonding apparatus of claim 2, wherein the bond tip is configured as a bond tip compression member vertically slidably disposed within the chamber, and further including a resilient compression element located above the bond tip compression member between a ceiling of a bore of a bond tip barrel from which the skirt extends downwardly, and a top of the bond tip compression member.

14. The thermocompression bonding apparatus of claim 13, further including a cooperative key and slot arrangement between the bond tip compression member and at least one of the bond tip barrel and the skirt, the cooperative key and slot arrangement configured to constrain movement of the bond tip compression member to the vertical.

15. The thermocompression bonding apparatus of claim 1, wherein the skirt comprises a tube of a heat reflective material extending downward from the bond head.

16. The thermocompression bonding apparatus of claim 15, wherein the tube comprises a metal material having a polished interior surface.

17. The thermocompression bonding apparatus of claim 15, further comprising a thermally insulative material surrounding and carried by the tube.

18. The thermocompression bonding apparatus of claim 17, further comprising a transparent coating of a low surface energy (LSE) material lining an inner surface of the heat reflective material.

19. The thermocompression bonding apparatus of claim 18, wherein the LSE material covers the compression surface of the bond tip.

20. The thermocompression bonding apparatus of claim 15, further comprising a transparent coating of a low surface energy (LSE) material lining an inner surface of the heat reflective material.

21. The thermocompression bonding apparatus of claim 15, wherein the bond tip is configured as a bond tip compression member vertically slidably disposed within the chamber, and further including a resilient compression element located above the bond tip compression member between a ceiling of the chamber and a top of the bond tip compression member.

22. The thermocompression bonding apparatus of claim 1, further comprising one or more ports carried by the bond head and opening into the open-bottomed chamber, and a vacuum source in communication with the one or more ports.

23. A method, comprising:
aligning a bond head of a thermocompression bonding tool with a stack of two or more microelectronic devices supported on a substrate;
lowering the bond head over the stack of microelectronic devices to surround and substantially enclose the stack in a chamber within a skirt secured to and extending vertically downward from the bond head and to contact an uppermost microelectronic device of the stack with a bond tip of the bond head within the chamber;
applying heat from the bond tip to the stack of microelectronic devices through the uppermost microelectronic device; and
reducing heat loss from the bond tip through the stack of microelectronic devices and from a periphery of the stack with the skirt.

24. The method of claim 23, further comprising adding heat to the stack of microelectronic devices from one or more heating devices carried by the skirt.

25. The method of claim 24, further comprising adding a different amount of heat from different vertical portions of the skirt using the one or more heating devices.

26. The method of claim 23, further comprising adding heat to the stack of microelectronic devices from substantially an entire periphery of the skirt from one or more heating devices carried by the skirt.

27. The method of claim 23, wherein reducing heat loss from the bond tip through the stack of microelectronic devices and from a periphery of the stack with the skirt comprises using material of the skirt comprising thermal insulation.

28. The method of claim 23, wherein reducing heat loss from the bond tip through the stack of microelectronic devices and from a periphery of the stack with the skirt comprises reflecting heat lost from the stack of microelectronic devices from the skirt with a polished metal material forming an interior surface of the skirt.

29. The method of claim 23, further comprising preventing adherence of dielectric material extruded peripherally from bondlines between microelectronic devices of the skirt and contacting an interior surface of the skirt.

30. The method of claim 29, wherein preventing adherence of dielectric material extruded peripherally from bondlines between microelectronic devices of the skirt and contacting an interior surface of the skirt comprises preventing adherence with a low surface energy (LSE) material lining the interior surface.

31. The method of claim 30, further comprising preventing adherence of dielectric material extruded peripherally from bondlines between microelectronic devices of the skirt to the bond tip with a LSE material coating the bond tip.

32. A method, comprising:
aligning a bond head of a thermocompression bonding tool with a stack of microelectronic devices;
lowering a bond head of a thermocompression bonding tool over the stack of microelectronic devices;
heating the stack of microelectronic devices with the bond head; and
substantially containing contaminant material outgassed from bondlines between microelectronic devices of the stack responsive to the heating within a chamber surrounded by a skirt carried by the bond head and substantially enclosing the stack.

33. The method of claim 32, further comprising preventing adherence of dielectric material extruded peripherally from the bondlines to the interior of the skirt.

34. The method of claim 32, further comprising reflecting heat lost from the stack of microelectronic devices from an interior of the skirt.

35. The method of claim 32, further comprising reducing heat loss from the stack of microelectronic devices with material of the skirt.

36. The method of claim 32, further comprising removing at least a portion of the contaminant material contained within the chamber before lifting the bond head from the stack of microelectronic devices.

37. The method of claim 36, wherein removing comprises lowering atmospheric pressure within the chamber with a vacuum source in communication with the chamber.

* * * * *